(12) United States Patent
Pham et al.

(10) Patent No.: US 7,541,240 B2
(45) Date of Patent: Jun. 2, 2009

(54) INTEGRATION PROCESS FLOW FOR FLASH DEVICES WITH LOW GAP FILL ASPECT RATIO

(75) Inventors: Tuan D. Pham, San Jose, CA (US); Masaaki Higashitani, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 173 days.

(21) Appl. No.: 11/254,142

(22) Filed: Oct. 18, 2005

(65) Prior Publication Data

US 2007/0087504 A1    Apr. 19, 2007

(51) Int. Cl.
H01L 21/336 (2006.01)
(52) U.S. Cl. ............................ 438/257; 438/294
(58) Field of Classification Search ............ 438/242, 438/294, 257
See application file for complete search history.

(56) References Cited

U.S. PATENT DOCUMENTS

| | | | |
|---|---|---|---|
| 5,043,940 A | 8/1991 | Harari | |
| 5,070,032 A | 12/1991 | Yuan et al. | |
| 5,095,344 A | 3/1992 | Harari | |
| 5,168,465 A | 12/1992 | Harari | |
| 5,172,338 A | 12/1992 | Mehrotra et al. | |
| 5,198,380 A | 3/1993 | Harari | |
| 5,268,318 A | 12/1993 | Harari | |
| 5,268,319 A | 12/1993 | Harari | |
| 5,297,148 A | 3/1994 | Harari et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,380,672 A | 1/1995 | Yuan et al. | |
| 5,385,630 A | * 1/1995 | Philipossian et al. | .......... 216/13 |
| 5,389,808 A | 2/1995 | Arai | |
| 5,459,091 A | 10/1995 | Hwang | |
| 5,512,505 A | 4/1996 | Yuan et al. | |
| 5,534,456 A | 7/1996 | Yuan et al. | |
| 5,554,553 A | 9/1996 | Harari | |

(Continued)

FOREIGN PATENT DOCUMENTS

DE    196 17 632    7/1997

(Continued)

OTHER PUBLICATIONS

"Planarized NVRAM Cell with Self-Aligned BL-BL and WL-BL Isolations", IBM Technical Disclosure Bulletin, IBM Corp. New York, US, vol. 36, No. 2, Feb. 1, 1993, pp. 375-377.

EPO/ISA, Communication Relating to the Results of the Partial International Search, mailed in corresponding International Application No. PCT/US2006/039931 (published as WO 2007/047390) on Feb. 8, 2007, 5 pages.

(Continued)

*Primary Examiner*—N Drew Richards
*Assistant Examiner*—Grant S Withers
(74) *Attorney, Agent, or Firm*—Vierra Magen Marcus & DeNiro LLP

(57) ABSTRACT

A non-volatile memory is formed having shallow trench isolation structures between floating gates and having control gates extending between floating gates where shallow trench isolation dielectric is etched. Control of etch depth is achieved using ion implantation to create a layer of dielectric with a high etch rate compared with the underlying dielectric. A conductive layer overlies the substrate during implantation. A substrate having small polysilicon features in a memory array and large polysilicon features in a peripheral area is accurately planarized using protrusions in the peripheral area and a soft chemical mechanical polishing step that stops when protrusions are removed.

12 Claims, 16 Drawing Sheets

U.S. PATENT DOCUMENTS

| | | |
|---|---|---|
| 5,579,259 A | 11/1996 | Samachisa et al. |
| 5,595,924 A | 1/1997 | Yuan et al. |
| 5,640,032 A | 6/1997 | Tomioka |
| 5,654,217 A | 8/1997 | Yuan et al. |
| 5,661,053 A | 8/1997 | Yuan |
| 5,677,872 A | 10/1997 | Samachisa et al. |
| 5,712,179 A | 1/1998 | Yuan |
| 5,712,180 A | 1/1998 | Guterman et al. |
| 5,716,863 A | 2/1998 | Arai |
| 5,747,359 A | 5/1998 | Yuan et al. |
| 5,756,385 A | 5/1998 | Yuan et al. |
| 5,786,988 A | 7/1998 | Harari |
| 5,817,580 A | 10/1998 | Violette |
| 5,847,425 A | 12/1998 | Yuan et al. |
| 5,867,429 A | 2/1999 | Chen et al. |
| 5,883,409 A | 3/1999 | Guterman et al. |
| 5,891,752 A | 4/1999 | Losee ................... 438/75 |
| 5,899,736 A * | 5/1999 | Weigand et al. ........... 438/601 |
| 5,923,976 A | 7/1999 | Kim |
| 5,950,096 A * | 9/1999 | Huang et al. ............. 438/443 |
| 5,965,913 A | 10/1999 | Yuan et al. |
| 5,966,618 A | 10/1999 | Sun et al. |
| 5,981,335 A | 11/1999 | Chi |
| 5,999,448 A | 12/1999 | Kurihara et al. |
| 6,028,336 A | 2/2000 | Yuan |
| 6,046,935 A | 4/2000 | Takeuchi et al. |
| 6,060,360 A | 5/2000 | Lin et al. |
| 6,103,573 A | 8/2000 | Harari et al. |
| 6,151,248 A | 11/2000 | Harari et al. |
| 6,172,395 B1 | 1/2001 | Chen et al. |
| 6,184,093 B1 | 2/2001 | Sung |
| 6,208,545 B1 | 3/2001 | Leedy |
| 6,222,762 B1 | 4/2001 | Guterman et al. |
| 6,235,586 B1 | 5/2001 | Au et al. |
| 6,258,665 B1 | 7/2001 | Shimizu et al. |
| 6,281,075 B1 | 8/2001 | Yuan et al. |
| 6,281,077 B1 | 8/2001 | Patelmo et al. |
| 6,295,227 B1 | 9/2001 | Sakui et al. |
| 6,297,097 B1 | 10/2001 | Jeong |
| 6,326,263 B1 | 12/2001 | Hsieh |
| 6,365,525 B2 | 4/2002 | Müller |
| 6,391,722 B1 | 5/2002 | Koh |
| 6,417,051 B1 | 7/2002 | Takebuchi |
| 6,417,538 B1 | 7/2002 | Choi |
| 6,455,440 B1 | 9/2002 | Jeng |
| 6,455,889 B2 | 9/2002 | Sakui |
| 6,461,973 B1 | 10/2002 | Hui et al. |
| 6,465,323 B1 | 10/2002 | Yu et al. |
| 6,483,146 B2 | 11/2002 | Lee et al. |
| 6,512,263 B1 | 1/2003 | Yuan et al. |
| 6,529,410 B1 | 3/2003 | Han et al. |
| 6,544,431 B2 | 4/2003 | Gill et al. |
| 6,548,374 B2 | 4/2003 | Chung |
| 6,559,008 B2 | 5/2003 | Rabkin et al. |
| 6,562,682 B1 | 5/2003 | Chiu et al. |
| 6,614,684 B1 | 9/2003 | Shukuri et al. |
| 6,620,681 B1 | 9/2003 | Kim et al. |
| 6,642,109 B2 * | 11/2003 | Lee et al. ............... 438/257 |
| 6,713,385 B1 | 3/2004 | Pipes et al. ............. 438/637 |
| 6,713,834 B2 | 3/2004 | Mori et al. |
| 6,762,092 B2 | 7/2004 | Yuan et al. |
| 6,770,932 B2 | 8/2004 | Himeno et al. |
| 6,791,142 B2 | 9/2004 | Tseng |
| 6,794,708 B2 | 9/2004 | Mori |
| 6,838,357 B2 | 1/2005 | Chen et al. |
| 6,844,586 B2 | 1/2005 | Ding |
| 6,855,966 B2 | 2/2005 | Chuang et al. |
| 6,891,246 B2 | 5/2005 | Aritome |
| 6,893,918 B1 | 5/2005 | Wang et al. ............. 438/257 |
| 6,894,930 B2 | 5/2005 | Chien et al. |
| 6,897,517 B2 * | 5/2005 | Van Houdt et al. .......... 257/315 |
| 6,897,524 B2 | 5/2005 | Kamiya |
| 6,898,121 B2 | 5/2005 | Chien et al. |
| 6,908,817 B2 | 6/2005 | Yuan |
| 7,023,049 B2 | 4/2006 | Takebuchi et al. |
| 2002/0048897 A1 | 4/2002 | Hong |
| 2002/0072197 A1 | 6/2002 | Kang et al. |
| 2002/0160570 A1 * | 10/2002 | Tseng ................... 438/257 |
| 2002/0197800 A1 | 12/2002 | Hashimoto et al. |
| 2003/0015497 A1 | 1/2003 | Gill et al. |
| 2003/0029839 A1 | 2/2003 | Chou |
| 2003/0119263 A1 | 6/2003 | Lee et al. ............... 438/259 |
| 2004/0084713 A1 | 5/2004 | Hsieh |
| 2004/0126972 A1 | 7/2004 | Dong et al. |
| 2004/0191992 A1 | 9/2004 | Ni et al. ............... 438/259 |
| 2005/0082614 A1 * | 4/2005 | Takehiro ............... 257/347 |
| 2005/0106813 A1 | 5/2005 | Lee et al. ............... 438/257 |
| 2005/0127473 A1 | 6/2005 | Sakagami ............... 257/510 |
| 2005/0199939 A1 | 9/2005 | Lutze et al. |
| 2006/0134845 A1 * | 6/2006 | Pham et al. ............. 438/200 |

FOREIGN PATENT DOCUMENTS

| | | |
|---|---|---|
| EP | 1274132 | 1/2003 |
| EP | 1363324 | 11/2003 |
| JP | 05190809 | 7/1993 |
| JP | 2001-135736 | 5/2001 |
| WO | WO 01/24268 A1 | 4/2001 |
| WO | WO 2007/047390 A2 | 4/2007 |
| WO | WO 2007/047390 A3 | 4/2007 |

OTHER PUBLICATIONS

EPO/ISA, Notification of the International Search Report and the Written Opinion of the International Searching Authority, or the Declaration, mailed in corresponding International Application No. PCT/US2006/039931 (published as WO 2007/047390) on Apr. 17, 2007, 17 pages.

Aritome, Seiichi, "Advanced Flash Memory Technology and Trends for File Storage Application," IEDM Technical Digest, International Electronic Devices Meeting, IEEE, San Francisco, California, Dec. 10-13, 2000, pp. 33.1.1-33.1.4.

Chan, et al., "A True Single-Transistor Oxide-Nitride-Oxide EEPROM Device," *IEEE Electron Device Letters*, vol. EDL-8, No. 3, Mar. 1987, pp. 93-95.

DiMaria et al., "Electrically-alterable read-only-memory using Si-rich $SIO_2$ injectors and a floating polycrystalline silicon storage layer," *J. Appl. Phys.* 52(7), Jul. 1981, pp. 4825-4842.

Eitan et al., "NROM: A Novel Localized Trapping, 2-Bit Nonvolatile Memory Cell," *IEEE Electron Device Letters*, vol. 21, No. 11, Nov. 2000, pp. 543-545.

Higashitani et al., "Multi-Thickness Dielectric for Semiconductor Memory," U.S. Appl. No. 11/020,402, filed Dec. 22, 2004, 27 pages.

Hori et al., "A MOSFET with Si-implanted Gate-$SiO_2$ Insulator for Nonvolatile Memory Applications," IEDM 92, Apr. 1992, pp. 469-472.

Lee, Jae-Duk, et al., "Effects of Parasitic Capacitance on NAND Flash Memory Cell Operation," Non-Volatile Semiconductor Memory Workshop, IEEE, Monterey, California, Aug. 12-16, 2001, pp. 90-92.

Nozaki et al., "A 1-Mb EEPROM with MONOS Memory Cell for Semiconductor Disk Application," *IEEE Journal of Solid State Circuits*, vol. 26, No. 4, Apr. 1991, pp. 497-501.

Park et al., "8Gb MLC (Multi-Level Cell) NAND Flash Memory using 63nm Process Technology", Samsung Electronics, Co., LTD., Semiconductor R & D Center, pp. 1-4, Dec. 15, 2004.

Pham et al., "Low-Voltage, Multiple Thin-Gate Oxide and Low-Resistance Gate Electrode", U.S. Appl. No. 11/021,693, filed Dec. 22, 2004, 25 pages.

Takeuchi, Y., et al., "A Self-Aligned STI Process Integration for Low Cost and Highly Reliable lGbit Flash Memories," 1998 Symposium on VLSI Technology; Digest of Technical Papers, IEEE, Honolulu, Hawaii, Jun. 9-11, 1998, pp. 102-103.

\* cited by examiner

INTEGRATION PROCESS FLOW FOR FLASH DEVICES WITH LOW GAP FILL ASPECT RATIO

FIELD OF THE INVENTION

This invention relates generally to non-volatile flash memory systems, and, more specifically, to the structures of memory cells and arrays of memory cells, and to the process of forming them.

BACKGROUND

There are many commercially successful non-volatile memory products being used today, particularly in the form of small form factor cards, which use an array of flash EEPROM (Electrically Erasable and Programmable Read Only Memory) cells. Such cards may be interfaced with a host, for example, by removably inserting a card into a card slot in a host. Some of the commercially available cards are Compact-Flash™ (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment.

In one type of architecture, a NAND array, wherein series strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. An example of a NAND architecture array and its operation as part of a memory system is found in U.S. Pat. No. 6,046,935, which patent is incorporated herein in its entirety by this reference. NAND memory devices have been found to be particularly suitable for mass storage applications such as those using removable memory cards. In an alternative arrangement to the separate card and host described above, in some examples a memory system is permanently connected to a host providing an embedded memory that is dedicated to the host.

As in most integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk. When this happens, designers will turn to a new or different layout or architecture of the circuit being implemented in order to reduce the amount of silicon area required to perform its functions. The shrinking of the above-described flash EEPROM integrated circuit systems can reach such limits.

One way to form small cells is to use a self-aligned Shallow Trench Isolation (STI) technique. This uses STI structures to isolate adjacent strings of floating gate cells such as those of NAND type memory arrays. According to this technique, a gate dielectric (tunnel dielectric) layer and floating gate polysilicon layer are formed first. Next, STI structures are formed by etching the gate dielectric and floating gate polysilicon layers and the underlying substrate to form trenches. These trenches are then filled with a suitable material (such as oxide) to form STI structures. The portions of the gate dielectric and floating gate polysilicon layers between STI structures are defined by the STI structures and are therefore considered to be self-aligned to the STI structures. Typically, the STI structures have a width that is equal to the minimum feature size that can be produced with the processing technology used. STI structures are also generally spaced apart by the minimum feature size. Thus, the portions of the gate dielectric and floating gate polysilicon layers between STI regions may also have a width that is equal to the minimum feature size. The strips of floating gate polysilicon are further formed into individual floating gates in later steps.

In NAND and other types of non-volatile memories, the amount of field coupling between floating gates and the control gates passing over them (the coupling ratio) is carefully controlled. The amount of coupling determines how much of a voltage that is placed on the control gate is coupled to the underlying floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described by Yuan et al in U.S. Pat. No. 5,343,063, which patent is incorporated herein in its entirety by this reference. The approach described in that patent is to make the floating gates thicker than usual to provide large vertical surfaces that may be coupled with the control gates.

One problem with simply making a floating gate thicker is that the aspect ratio of STI structures formed between floating gates increases. The aspect ratio is equal to the height of the STI structure divided by its width. Thus, as the height of the floating gate increases and the height of the STI structure increases accordingly, the aspect ratio increases. Filling STI trenches that have a high aspect ratio may present certain problems. These problems are of particular concern for newer generations of memory devices that have a very small minimum feature size. The width of the STI structure in such devices may be shrunk to a very small dimension, while the depth required to electrically isolate neighboring cells remains approximately the same. Thus, the aspect ratio for such STI structures tends to be high. If the aspect ratio is too high, STI structures may not be of adequate quality. For example, voids may be formed because deposition at the opening of the STI trenches reduces deposition towards the bottom of the trenches. Such voids may cause faulty devices and contribute to yield loss.

Another problem with increasing floating gate thickness and having coupling along a vertical surface of a floating gate is that it may be difficult to accurately and uniformly control the dimensions of such surfaces. Where vertical extensions of the control gate extend downwards to provide increased coupling, the lengths of such extensions are critical. Variation in the length of such extensions may cause unacceptable variation in the coupling ratio. If the extensions are too long they may affect the channel region that underlies the gate dielectric.

A memory array is generally fabricated on a semiconductor chip with some peripheral circuits. Typically, memory arrays are made on substrates where a single substrate is later divided into separate chips with each chip having one or more memory arrays. Certain peripheral circuits may also be fabricated in a peripheral area on the same chip as a memory array. In this way, peripheral circuits may be directly connected to the memory array. Peripheral circuits may include driver circuits, sense amplifiers, charge pumps, decoder circuits, controller circuits and interface circuits. In some examples, some of these circuits are not formed in the peripheral area but are formed on a separate chip. Thus, peripheral circuits may be different from one memory chip to another. Any circuit that is fabricated on the same chip as a memory array but is not a part of the memory array may be considered to be a peripheral circuit. The area of such a chip that is outside the memory array may be considered the peripheral area. Peripheral circuits may be very different from circuits of the memory array. For example, larger devices with thicker gate dielectric may be present in the peripheral area in order to handle high voltages. The differences between the memory array and peripheral area may cause problems with certain process steps.

One process step that may produce different results in the memory array and peripheral area is Chemical Mechanical Polishing (CMP). CMP may be used to planarize a surface of a substrate by polishing the surface against an abrasive pad with a chemical slurry between the surface and the pad. Typically, prior to CMP the surface is uneven because of deposition or removal of one or more layers of material. In principle, CMP removes material across the wafer surface in a manner that leaves a planar surface. In reality, local features may cause the surface to be non-planar. For example, a depression in a surface prior to CMP may remain to some extent after CMP. Such "dishing" is the result of removal of material at the bottom of the depression where the depression is wide enough to allow CMP action at the bottom of the depression. Dishing tends only to occur for larger depressions so that it may not affect a memory array but may be significant for a peripheral area having large features. Previous approaches to the problem of dishing include forming dummy patterns in the area where dishing is likely to occur so that there is more material to remove in this area. However, forming dummy patterns generally involves an extra patterning step to establish the locations of the dummy patterns.

Thus, there is a need for a method of forming a memory array with low aspect ratio STI structures and a high coupling ratio between floating gates and control gates. There is also a need for a method of forming a memory array that has a high degree of control of the coupling between floating gates and control gates so that the coupling ratio is uniform. There is also a need for a method of forming a memory array on a memory chip having peripheral circuits where planarization is achieved across both the memory array and the peripheral circuits.

SUMMARY

A method of forming a memory chip provides a high degree of control over the coupling ratio between floating gates and control gates by controlling the length of vertical extensions of the control gates. This is done by implanting STI portions that are to be removed for control gate extensions and selectively removing implanted STI material. This gives improved control of etch depth over a simple timed etch. High uniformity of coupling is achieved from cell to cell and the separation between control gate and gate oxide is maintained at a safe distance. Dishing of larger peripheral structures during planarizing is prevented by providing protrusions above a planarization level and using a soft etch to remove these protrusions and stop at the planarization level. Once a planarized surface of the same material is achieved, subsequent processing steps (such as CMP) provide a more level surface than would be produced starting from an unplanarized surface.

A method of forming a memory chip includes forming gate dielectric layers in both the memory array and the peripheral area and forming a first floating gate layer (FG1) of polysilicon overlying the gate dielectrics. A Silicon Nitride (SiN) layer is deposited over the first floating gate layer. STI trenches are then formed to separate different components (first floating gate portions FG1). The STI trenches are filled with oxide to provide STI structures that electrically isolate neighboring floating gate portions. SiN portions are then removed and a second polysilicon layer is deposited and etched-back to form second floating gate portions (FG2). An extra etch step option also can be added prior to the FG2 deposition to widen the FG2 cavity to a desired width. The FG2 portions basically then replace SiN portions in the memory array. Thus, FG1 and FG2 portions form floating gates that are of the desired height and width compared to the STI depth, without increasing the original STI aspect ratio, while providing a large vertical floating gate surfaces for achieving good cell coupling ratio.

In the peripheral area, the second polysilicon layer is patterned so that FG2 portions that overlie the first floating gate portions and that extend partially over STI structures are not removed. The parts of these portions overlying the STI structures protrude above the upper surface of the STI structures. A third conductive polysilicon layer is then deposited over the substrate, covering the memory array and peripheral circuits including the protrusions. This provides a substantially planar upper surface in the memory array area and over central portions of STI structures in the peripheral area with protrusions above the planar surface in the peripheral area. Next a planarization step removes the protrusions down to a level of the upper surface of the third polysilicon layer over the STI structures. This provides a substantially planar surface over both the memory array and peripheral areas.

Implantation of ions through the conductive polysilicon into the underlying STI structures is performed so that only the upper layer of the STI structures receives significant amounts of implanted ions. The conductive polysilicon prevents implanted ions charging to the gate oxide in both of the memory array and peripheral circuitry. Subsequently, the polysilicon is removed down to the level of the top of the STI structures (leaving FG2 portions in both memory array and peripheral areas). This leaves substantially planar (without dishing) FG2 portions in both the memory array and peripheral area because the upper surface was substantially planar prior to removal. The implanted upper layer of the STI structures is then etched away. Because this upper layer of oxide is implanted it may be etched selectively faster than the lower, unimplanted oxide. Thus, an implant condition may be chosen to produce an implant profile that has a high implanted ion concentration in the layer that is to be etched and a low ion concentration in the underlying oxide. In this way, the unimplanted oxide acts similarly to an etch-stop layer because the etch rate increases when the etch reaches the unimplanted oxide. The depth of the etch may be accurately controlled in this way so that oxide removal is uniform across the substrate.

Subsequent to removal of the upper portions of STI structures, a dielectric layer is formed across the substrate and another conductive polysilicon layer is deposited over the substrate. This polysilicon layer later forms control gates. This dielectric layer extends into the gaps formed by removal of the upper portions of the STI structures. Coupling between floating gates and control gates depends on the depth to which the control gates extend which in turn depends on how deeply the oxide was etched. Thus, by improving control of oxide etch depth, the coupling between control gates and floating gates may be controlled more accurately and made more uniform. The control gates may, be prevented from extending to a depth where they may inadvertently affect the device characteristics.

DESCRIPTION OF EXEMPLARY EMBODIMENTS

Figure 1:
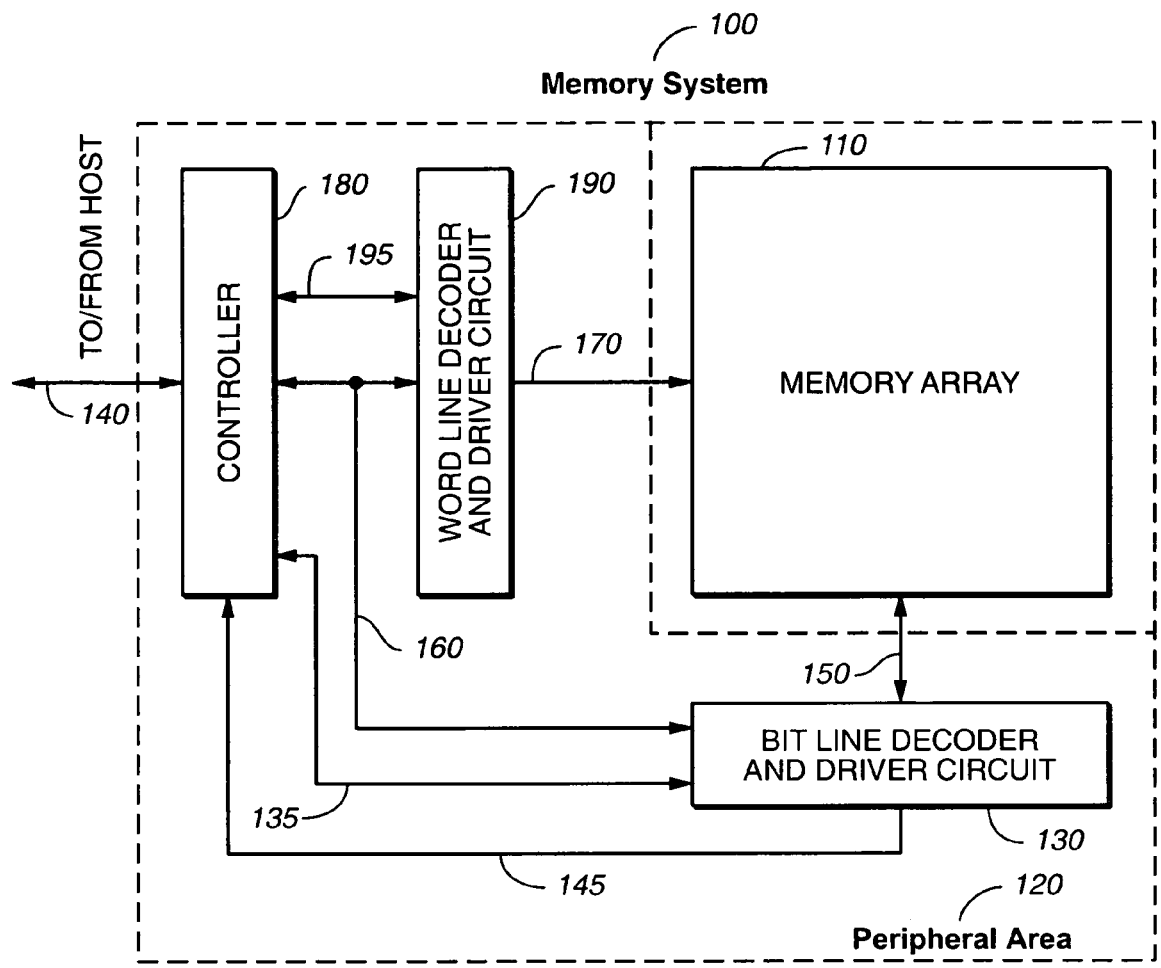
FIG. 1 shows a block diagram of a memory system 100 having a memory array 110 and peripheral area.

An example of a memory system 100 incorporating the various aspects of the present invention is generally illustrated in the block diagram of FIG. 1. A large number of individually addressable memory cells are arranged in a regular array 110 of rows and columns, although other physical arrangements of cells are certainly possible. Bit lines, designated herein to extend along columns of the array 110, are electrically connected with a bit line decoder and driver circuit 130 through lines 150. Word lines, which are designated in this description to extend along rows of the array 110, are electrically connected through lines 170 to a word line decoder and driver circuit 190. Each of the decoders 130 and 190 receives memory cell addresses over a bus 160 from a memory controller 180. The decoder and driving circuits are also connected to the controller 180 over respective control and status signal lines 135 and 195.

The controller 180 is connectable through lines 140 to a host device (not shown). The host may be a personal computer, notebook computer, digital camera, audio player, various other hand held electronic devices, and the like. The memory system 100 of FIG. 1 will commonly be implemented in a card according to one of several existing physical and electrical standards, such as one from the PCMCIA, the CompactFlash™ Association, the MMC™ Association, and others. When in a card format, the lines 140 terminate in a connector on the card that interfaces with a complementary connector of the host device. The electrical interface of many cards follows the ATA standard, wherein the memory system appears to the host as if it was a magnetic disk drive. Other memory card interface standards also exist. In some systems, a memory card may not have a controller and the functions of the controller may be carried out by the host. As an alternative to the card format, a memory system of the type shown in FIG. 1 may be permanently embedded in the host device.

The decoder and driver circuits 130 and 190 generate appropriate voltages in their respective lines of the array 110, as addressed over the bus 160, according to control signals in respective control and status lines 135 and 195, to execute programming, reading and erasing functions. Any status signals, including voltage levels and other array parameters, are provided by the array 110 to the controller 180 over the same control and status lines 135 and 195. A plurality of sense amplifiers within the circuit 130 receive current or voltage levels that are indicative of the states of addressed memory cells within the array 110, and provides the controller 180 with information about those states over lines 145 during a read operation. A large number of sense amplifiers are usually used in order to be able to read the states of a large number of memory cells in parallel. During reading and program operations, one row of cells is typically addressed at a time through the circuits 190 for accessing a number of cells in the addressed row that are selected by the circuit 130. During an erase operation, all cells in each of many rows are typically addressed together as a block for simultaneous erasure. Circuits such as decoder and driver circuits 130 and 190 may be considered to be peripheral circuits.

Any circuit in memory system 100 that is outside memory array 110 may be considered to be a peripheral circuit and the area where such circuits are formed may be considered a peripheral area 120.

Figure 2:
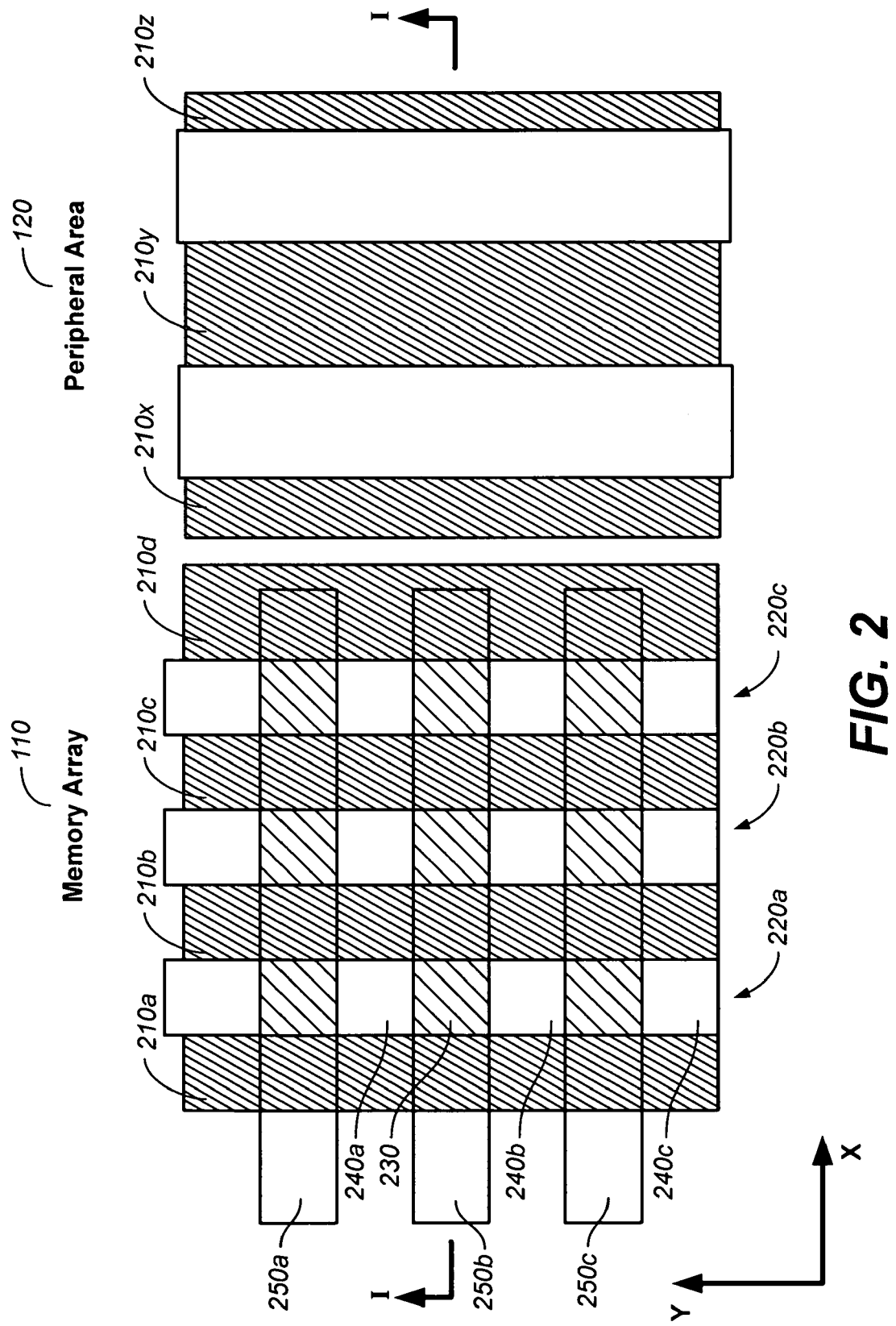
FIG. 2 shows a top-view of portions of a memory chip that has memory system 100 including a portion of memory array 110 and a portion of peripheral area 120.

A plan view of the NAND memory cell array 110 formed on a silicon substrate is shown in FIG. 2, wherein a small part of its repetitive structure of conductive elements is illustrated with little detail of dielectric layers that exist between the elements, for clarity of explanation. Shallow Trench Isolation (STI) structures 210a-210d are formed extending through the surface of the substrate. In order to provide a convention for this description, the STI regions are shown to be spaced apart in a first x-direction, with lengths extending in a second y-direction, these first and second directions being essentially orthogonal with each other.

Between the STI structures 210a-210d, there are strings 220a-220c of memory cells running in the y-direction. Thus, the direction of the strings is parallel to the direction of the STI regions. Each string 220a-220c includes many memory devices connected in series. FIG. 2 shows portions of three such strings 220a-220c with three memory cells shown for each string. However, strings 220a-220c contain additional cells that are not shown in FIG. 2. Also, the array 110 contains additional strings that are not represented in FIG. 2. This type of array may have thousands of strings with 16, 32 or more cells in each string.

A memory cell includes a floating gate 230 and conductive source/drain regions 240a and 240b in the substrate adjacent to the floating gate, on either side in the y-direction. Strings are separated by STI structures 210a-210d. STI structures 210a-210d form isolating elements that electrically isolate source/drain regions from other source/drain regions of cells in adjacent strings. Along the y-direction source/drain regions 240a-240c are shared by adjacent cells. The source/drain regions 240a-240c electrically connect one cell to the next cell thus forming a string of cells. The source/drain regions 240a-240c in this example are formed by implanting impurities into the substrate in the required areas.

Word lines 250a-250c are shown extending across the array in the x-direction in FIG. 2. The word lines 250a-c overlie portions of the floating gates and also partially surround the floating gates. Similar arrays to the one shown are described in U.S. patent application Ser. No. 10/799,060, filed on Mar. 12, 2004, which application is hereby incorporated by reference in its entirety.

FIG. 2 also shows a portion of the peripheral area 120. Typically, devices are formed in peripheral area 120 at the same time that the memory array is formed. Devices in peripheral area 120 may be larger than those of the memory array 110. For example, certain large high-voltage devices may be formed in peripheral area 120. Large STI structures 210x, 210y are formed in peripheral area 120. Descriptions of memory systems having memory arrays and peripheral circuits and certain processes for forming them are given in U.S. patent application Ser. Nos. 11/021,693 and 11/020,402, both filed on Dec. 22, 2004, which applications are hereby incorporated by reference in their entirety.

Not shown in FIG. 2 are metal conductor layers. Since the polysilicon elements usually have a conductivity that is significantly less than that of metal, metal conductors are included in separate layers with connections made to respective metal lines through any intermediate layers at periodical intervals along the lengths of the polysilicon elements. Also, the word line may include a metal or metal-silicide portion to increase the electrical conductivity of the word line. For example, a refractory metal such as Cobalt or Tungsten may be used to form a silicide layer on top of the polysilicon layer. The silicide material has a higher conductivity than the polysilicon and thus improves electrical conduction along the word line.

Figure 3:
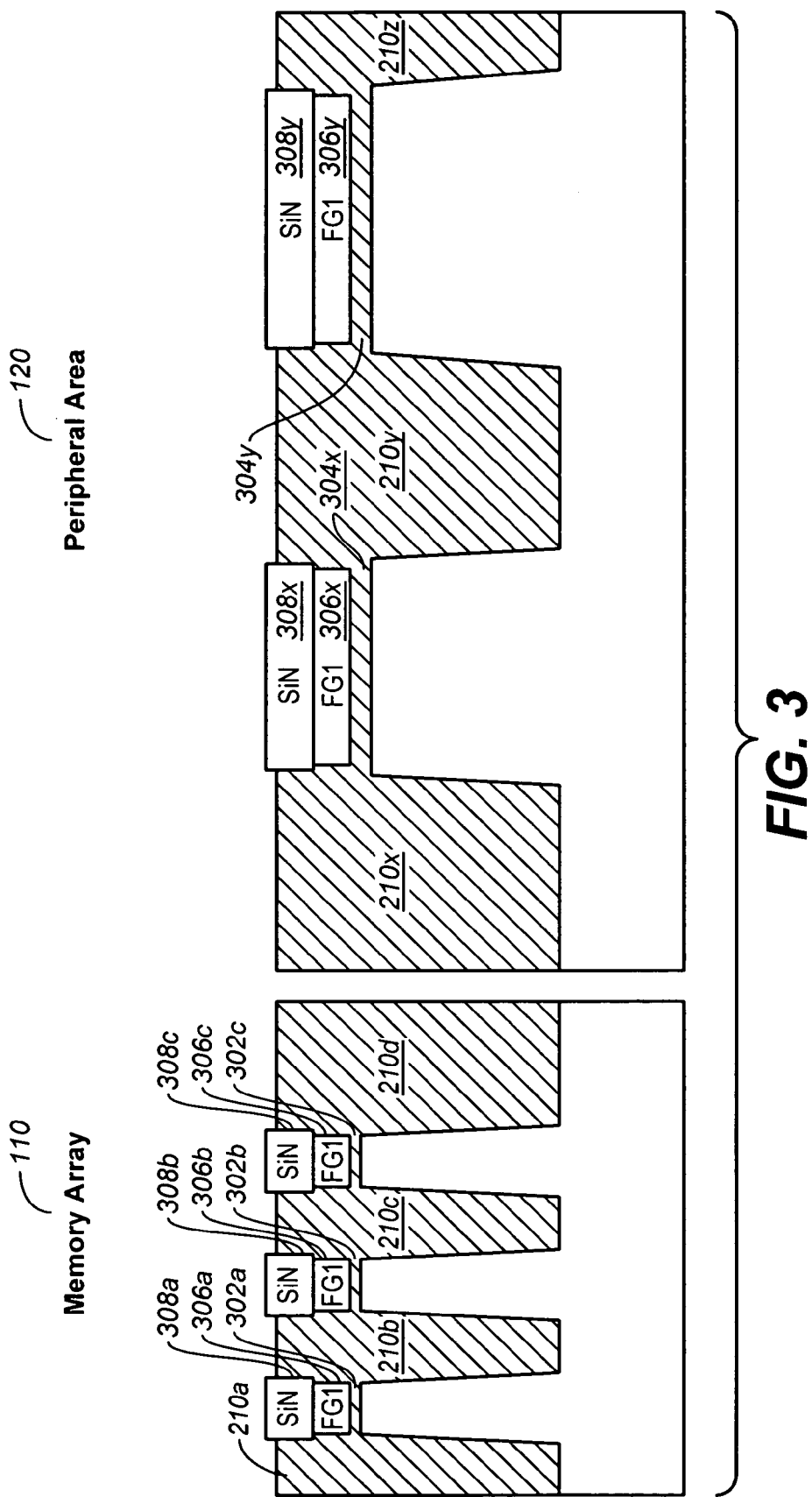
FIG. 3 shows the portions of the memory chip of FIG. 2 at an intermediate stage of fabrication in cross-section after formation of gate oxide layers, first polysilicon floating gate layer, SiN layer and STI structures in both memory array and peripheral area.

FIG. 3 shows a cross-section of the memory array 110 and peripheral area 120 of FIG. 2 at an intermediate stage of array fabrication. FIG. 3 shows a cross-section along the x-direction, indicated in FIG. 2 by I-I. In FIG. 3, gate dielectric layers, a first floating gate layer (FG1) and silicon nitride layer (SiN) have been formed and divided by formation of STI structures 210a-210d, 210x-210z into portions of gate dielectric material 302a-302c, 304x, 304y, portions of first floating gate material 306a-306c, 306x, 306y and portions of silicon nitride 308a-308c, 308x, 308y. A thin gate dielectric layer may be used in the memory array while a same or different gate dielectric layer thickness is used for peripheral circuits. In one example, approximately 70-90 Angstroms of gate dielectric is used in the memory array to form portions of gate dielectric 302a-302c, while 300-400 Angstroms of gate dielectric is used to form dielectric portions 304x, 304y for high voltage peripheral circuits in peripheral area 120. FG1 and SiN layers are formed over the gate dielectric layers. Subsequent to forming FG1 and SiN layers, STI structures 210a-210d, 210x-210y are formed. A photoresist mask layer may be used to define the locations of the STI structures 210a-210d, 210x-210y. The SiN is then etched according to the photoresist mask layer into portions 308a-308c, 308x, 308y. Subsequently, SiN portions 308a-308c, 308x, 308y form a hard-mask for subsequent trench etching. Typically, in a memory array the trenches have a width that is equal to the minimum feature size of the process used and are separated by a distance that is also equal to the minimum feature size. The minimum feature size is 55 nanometers in the present example, but aspects of the present invention may be applied to circuits of any size. By minimizing the size of the trenches and the distance between trenches, a high-density memory array may be formed. Larger trenches may be formed in the peripheral area. The trenches are then filled with a suitable dielectric. In one example a High Density Plasma (HDP) oxide process is used for filling the STI trenches. In this case Silicon dioxide (oxide) is used for trench fill. Typically, filling STI trenches with dielectric is done by overfilling with dielectric material and subsequently removing excess dielectric material using a HDP etch-back process. In the present embodiment, oxide is deposited to a thickness that fills STI trenches and covers the SiN portions 308a-308c, 308x, 308y. The oxide may then be planarized by CMP, leaving some oxide over SiN portions 308a-308c, 308x, 308y so that SiN portions 308a-308c, 308x, 308y are not damaged by CMP. Subsequently, the thickness of the oxide layer over SiN portions 308a-308c, 308x, 308y may be measured and an etch-back process may be performed to remove this layer. Typically, this etch-back is done with an over-etch of about 50 Angstroms so that SiN portions 308a-308c, 308x, 308y extend above the level of the STI structures 210a-210d, 210x-210z and no oxide remains over SiN portions 308a-308c, 308x, 308y.

The cross-section of FIG. 3 shows three portions 306a-306c of FG1 and three portions 308a-308c of SiN in memory array 110 that are separated by STI structures 210a-210d. Two additional portions 306x, 306y of FG1 and two additional portions 308x, 308y of SiN are shown in peripheral area 120. The FG1 portions 306a-306c, 306x, 306y and SiN portions 308a-308c, 308x, 308y are strips at this stage and are later formed into individual units. The structures are closely packed in the memory array but are more widely spaced in the peripheral area. Because of the small dimensions used in the memory array, the aspect ratio is of particular concern. In the present example, the SiN, gate oxide and the FG1 layer thicknesses, together with the STI depth divided by the width of the STI structure (minimum feature size, 55 nanometers) can give an aspect ratio of between 4 and 5.8. An aspect ratio of less than 6.0 has been found to provide acceptable results with the HDP oxide deposition process used in this example. Other processes may have other ranges of acceptable aspect ratio and the current invention is not limited to any particular deposition scheme or aspect ratio.

Figure 4:
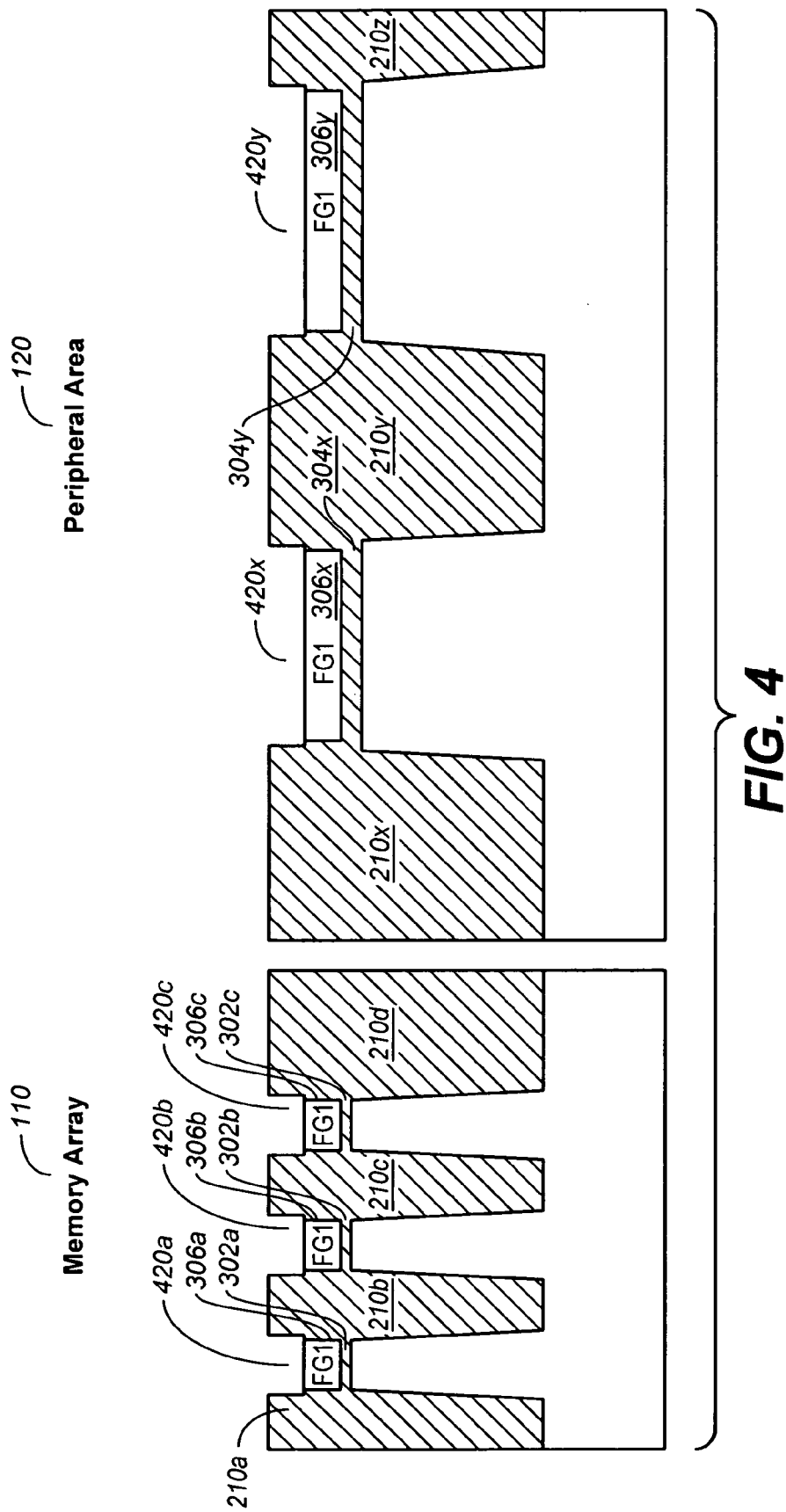
FIG. 4 shows the chip of FIG. 3 after removal of the SiN portions that overlie FG1 portions.

Subsequent to forming the STI structures 210a-210c, 210x-210z as shown in FIG. 3, SiN portions 308a-308c, 308x, 308y are removed. These portions may be removed using a hot Phosphoric Acid (H3PO4) etch to leave cavities 420a-420c, 420x, 420y over FG1 portions 306a-306c, 306x, 306y as shown in FIG. 4. Subsequent to removal of the SiN portions 308a-308c, 308x, 308y a cleaning process may be performed. In the present example, a clean with dilute Hydrofluoric Acid (DHF) removes a small amount of oxide (approximately 50 Angstroms) of STI portions 210a-210c, 210x-210z and thus widens the cavities 420a-420c, 420x, 420y. FIG. 4 shows the same view as in FIG. 3 after removal of SiN portions 308a-308c, 308x, 308y and cleaning. Cavities 420a-420c, for example, can have a depth of 500-600 Angstroms and a width of approximately 650 Angstroms in memory array 110. Cavities 420x, 420y in peripheral area 120 may be much wider. Thus, SiN portions 308a-308c, 308x, 308y act as placeholders that establish locations but are later removed. Because the SiN itself is removed, its properties are not critical and other materials could also be used for this purpose. SiN portions 308a-308c, 308x, 308y may be considered as dummy portions because they are later replaced. SiN portions 308a-308c, 308x, 308y also act as a hard-mask for trench etching so that they serve a dual purpose.

Figure 5:
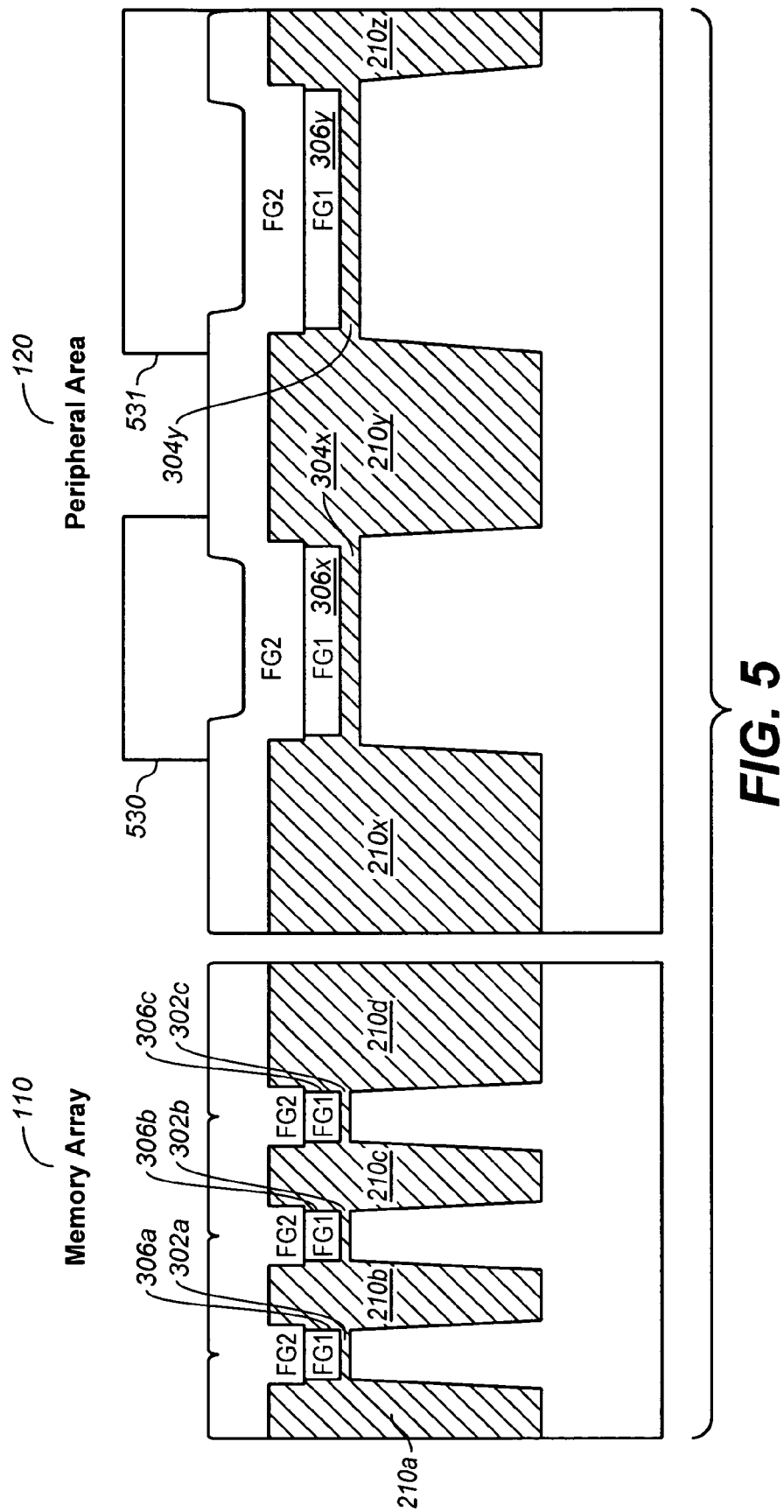
FIG. 5 shows the chip of FIG. 4 after deposition of a second polysilicon floating gate layer and a photoresist etch mask.

Subsequent to removal of SiN portions 308a-308c, 308x, 308y, another conductive layer is deposited over the substrate. In this example, this layer is made of polysilicon. Such layers may be deposited in a doped form, or may be deposited undoped and then later doped. FIG. 5 shows the same view as FIG. 4 with an additional polysilicon layer FG2 overlying FG1 portions 306a-306c, 306x, 306y and overlying STI structures 210a-210d, 210x-210z. In this example, FG2 is approximately 800-900 Angstroms thick. FG2 is in direct contact with FG1 portions 306a-306c, 306x, 306y so that they are electrically connected. In peripheral area 120, portions of FG2 are covered with photoresist masking layer portions 530, 531. Such layers are well known and may be formed by spinning on photoresist, then exposing the photoresist to UV light according to a predetermined pattern and removing portions of the photoresist according to whether they were exposed. The photoresist portions 530, 531 are shown extending over the parts of the FG2 layer that overlie FG1 portions 306x, 306y and also extending beyond these parts to overlie parts of the FG2 layer that overlie edges of STI structures 210x-210z. The memory array 110 is uncovered, as are central portions of the wide STI structures 210x-210z in peripheral area 120. An etch is then performed to remove exposed parts of the FG2 layer (parts not covered by the photoresist portions 530, 531).

Figure 6:
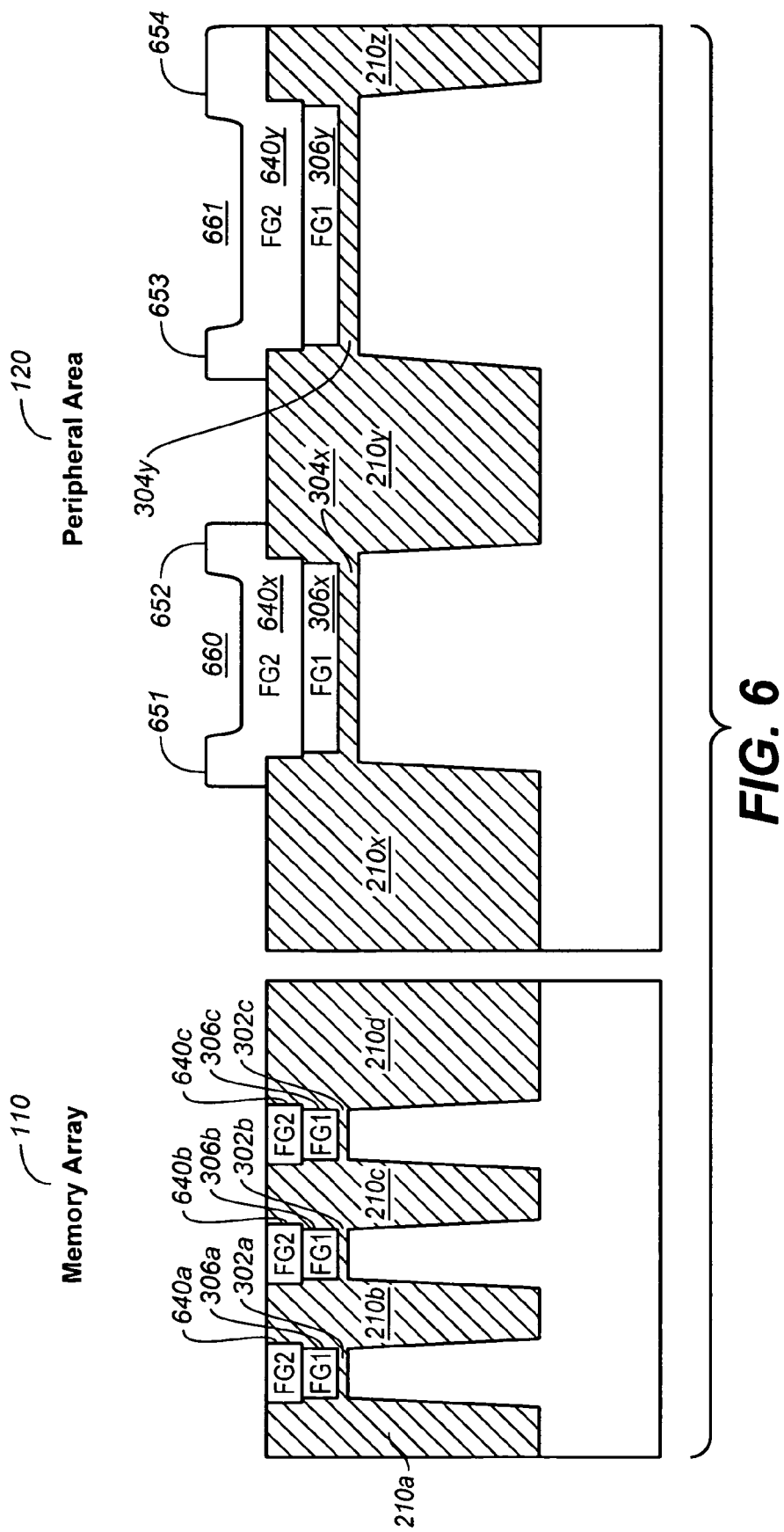
FIG. 6 shows the chip of FIG. 5 after an etch to remove exposed portions of the second floating gate layer, leaving protrusions of polysilicon above the STI surface.

FIG. 6 shows the result of removal of the exposed parts of the FG2 layer. The removal of these parts of FG2 (FG2 etch-back) is stopped when the etch reaches STI structures 210a-210d, 210x-210z so that FG2 portions in cavities 420a-420c, 420x, 420y remain. The tops of the remaining FG2 portions 640a-640c are at approximately the same level as the tops of STI structures 210a-210d that separate them at this point providing a substantially planar surface in the memory array 110. Thus, FG2 portions 640a-640c have replaced SiN portions 308a-308c at this point. This provides a floating gate structure consisting of FG1 portions 306a-306c and FG2 portions 640a-640c that are self-aligned to the STI structures 210a-210d and are equal in height to the STI structures 210a-210d. In contrast with some prior self-aligned processes, this process replaces SiN portions 308a-308c with FG2 portions 640a-640c and thereby makes a floating gate that is as high as the upper surface of the hard-mask used to form the STI trenches. Many prior systems have a hard-mask SiN layer that overlies both FG1 and FG2 layers but is not replaced. Thus, for a given thickness of FG1 and FG2 this requires a higher aspect ratio STI structure. Put another way, for a given aspect ratio STI structure, the present process provides a higher floating gate by reusing the space that was occupied by the SiN hard-mask portions for additional floating gate height. In addition, one can vary the FG1 and the FG2 layer to a desired thickness, to achieve good cell coupling ratio, while maintaining a low STI aspect ratio from the beginning.

In peripheral area 120, photoresist portions 530, 531 are removed after FG2 etch-back, leaving FG2 portions 640x, 640y that protrude above the level of the STI structures 210x-210z. Because raised portions 651-654 of the FG2 layer that extend over STI structures 210x-210z were masked, these portions remain and extend approximately 800-900 Angstroms above the level of STI structures 210x-210z. The parts of the FG2 layer that overlie FG1 portions 306x, 306y do not extend as high, so that depressions 660, 661 are present in the areas above FG1 portions 306x, 306y. Photoresist portions 530, 531 are removed as shown and a clean of the substrate may be performed after their removal. For example, a dilute Hydrofluoric Acid (DHF) clean may be performed that removes a small amount of oxide (50 Angstroms). Thus, FG2 portions 640a-640c extend slightly above the STI structures 210c-210d in the memory array region after the clean. Subsequently, another conductive layer is deposited. In this example, a third doped polysilicon layer, FG3 is deposited across the substrate.

Figure 7:
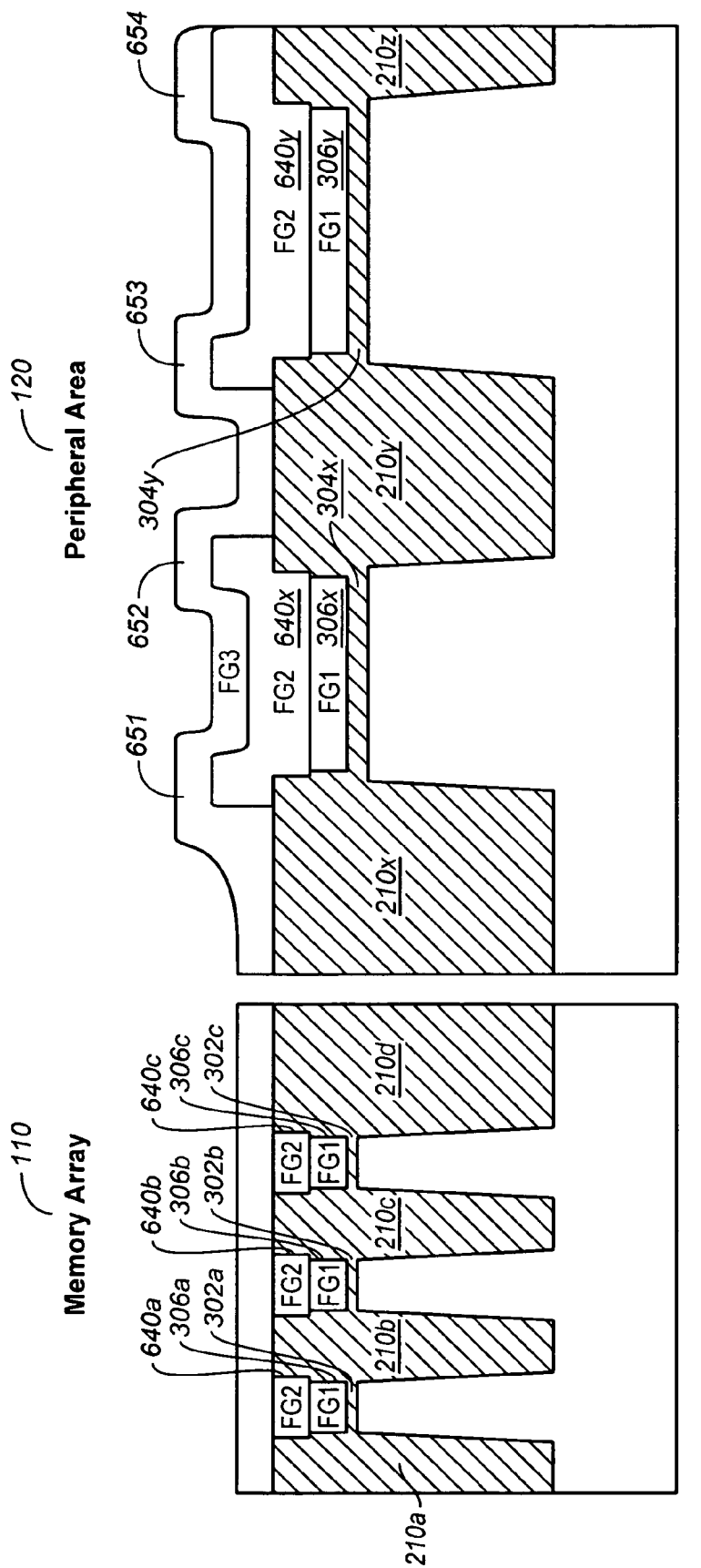
FIG. 7 shows the chip of FIG. 6 after deposition of a third polysilicon layer across the substrate.

FIG. 7 shows the same view as FIG. 6 after deposition of the FG3 layer. This layer extends over both memory array 110 and peripheral area 120. The FG3 layer shown consists of approximately 400-600 Angstroms of doped polysilicon. In memory array 110, the FG3 layer is substantially planar because the underlying FG2 portions 640a-640c and STI structures 210a-210d are approximately the same height (a difference of approximately 50 Angstroms). Thus, FG3 has a substantially planar upper surface in memory array 110 and over central portions of the wide STI structures 210x-210z of peripheral area 120. However, in peripheral area 120 there is a hill and valley profile with protrusions 651-654 extending upwards where the FG2 portions 640x, 640y overlie STI structures 210x-210z. Protrusions 651-654 may extend 1200-1300 Angstroms above the upper surface of the STI structures 210x-210z at this point. Protrusions 651-654 may be removed by performing a soft Chemical Mechanical Polishing (CMP) to remove only protrusions 651-654 without significantly affecting the flat upper surface of the FG3 layer. A soft CMP process involves using standard CMP apparatus and slurry but with very little pressure applied between the substrate and the pad. This provides enough pressure to ensure that protrusions are eroded, while not eroding the flat portions of the substrate.

Figure 8:
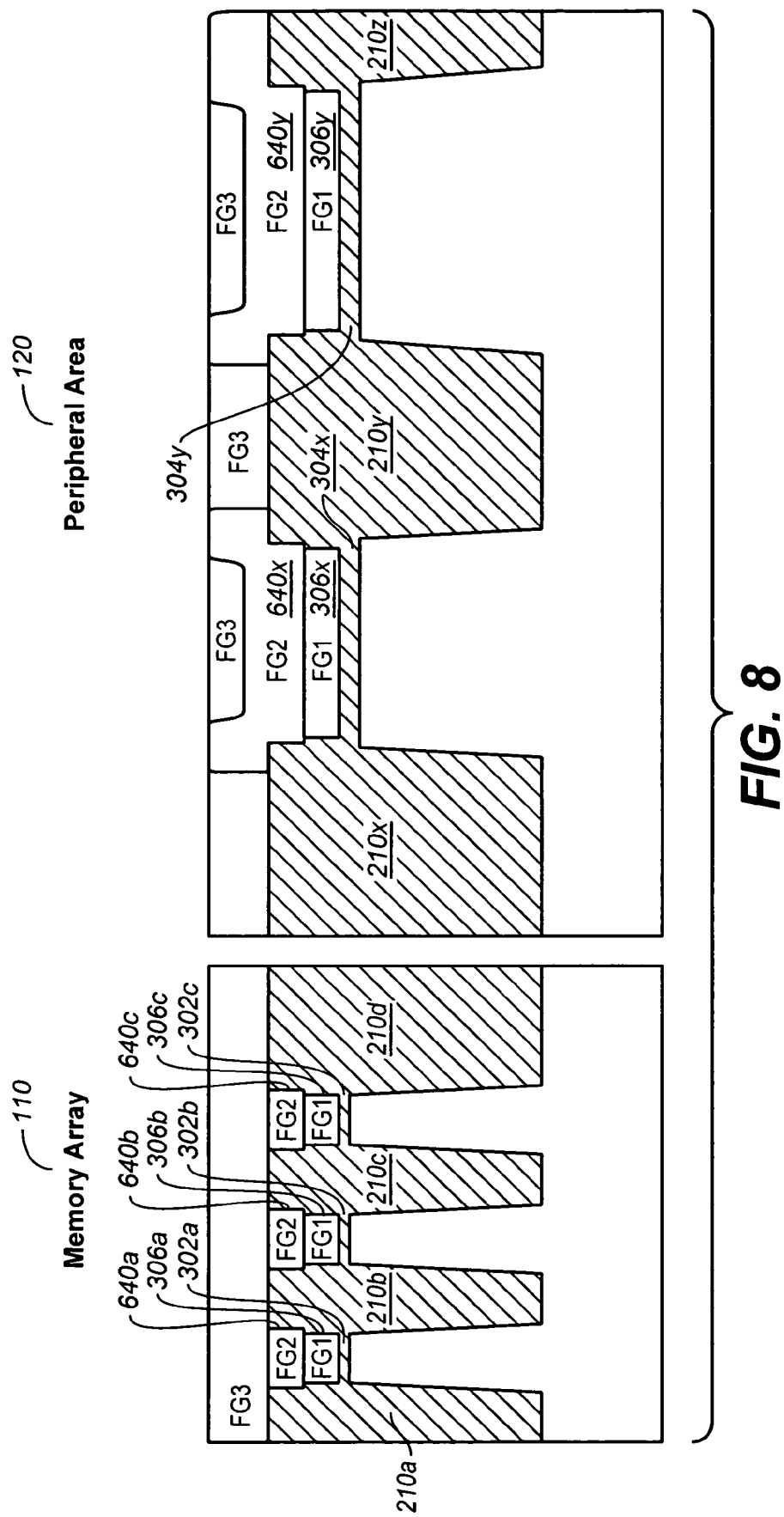
FIG. 8 shows the chip of FIG. 7 after planarization of the second and third gate layers down to the level of the substantially planar upper surface of the third gate layer.

FIG. 8 shows the result of a soft CMP process applied to the structures shown in FIG. 7. The CMP process removes protrusions 651-654 but stops when the flat portions of the FG3 layer (those portions in memory array 110 and over central parts of wide STI structures 210x-210z in peripheral area 120) begin to be eroded. In some cases, a limited amount of erosion of these areas may be desirable to fully planarize the FG3 layer. The CMP process may be stopped by endpoint detection or by timing. The result is a highly planarized polysilicon surface extending across the substrate overlying FG2 portions 640a-640c, 640x, 640y and STI structures 210a-210d, 210x-210z.

Figure 9:
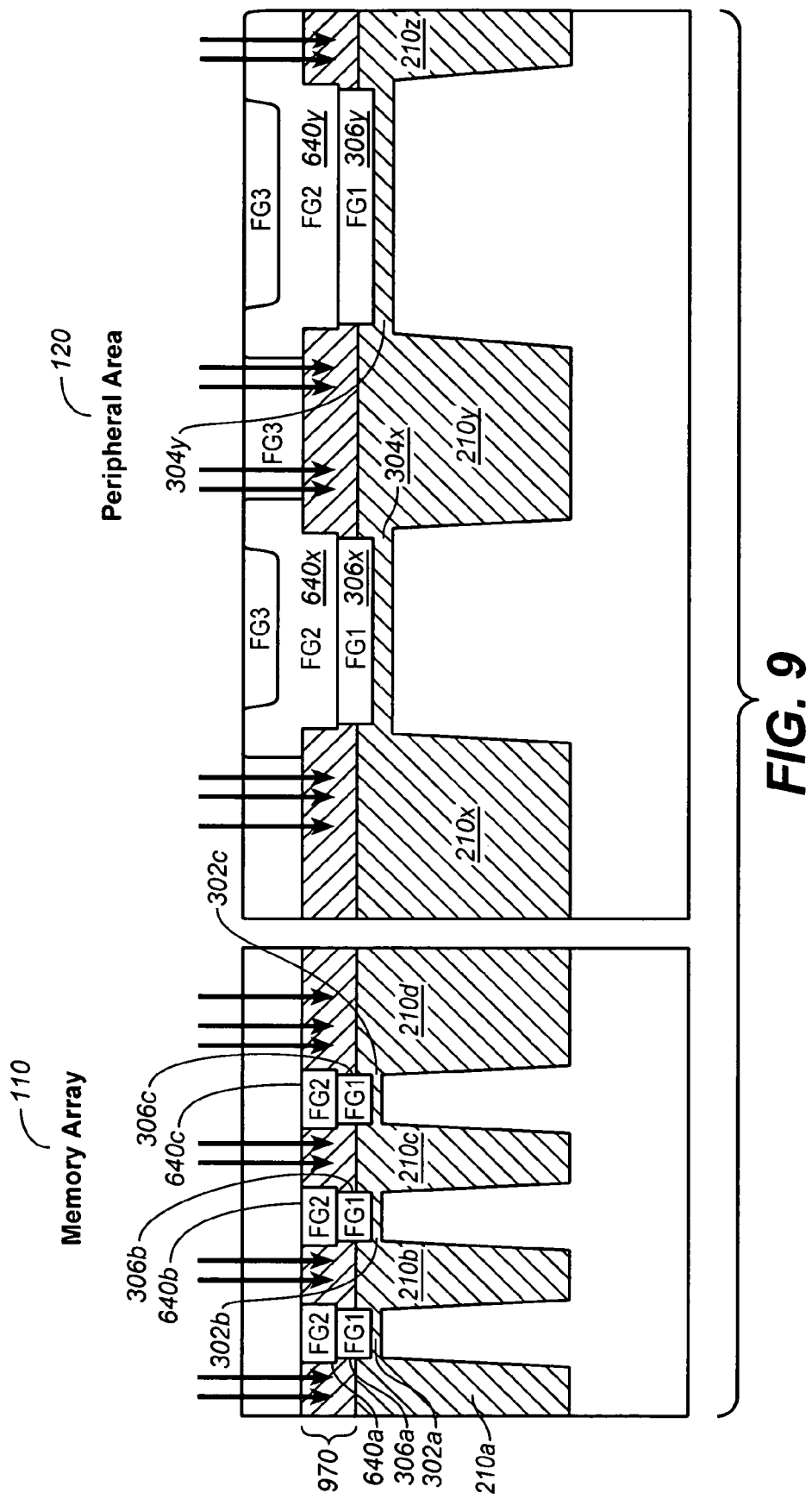
FIG. 9 shows the chip of FIG. 8 during ion implantation through the third gate layer into the upper portions of the STI structures.

Ions are implanted through the FG3 layer into the underlying STI structures 210a-210d, 210x-210z in FIG. 9. This implantation process may be done so that the ions are implanted to a predetermined depth. An implant energy may be selected so that the implanted ions do not penetrate below a certain level to a significant extent. Thus, the implant damage and concentration of implanted ions can be largely confined to a top implanted layer 970 of STI structures 210a-210d, 210x-210z and little implant damage or implanted ion concentration may exist below implanted top layer 970. For the process shown, implanted layer 970 may extend to a depth of approximately 700 Angstroms into the STI structures 210a-210d, 210x-210z. The implanted layer 970 may extend to a depth of 500 Angstroms in other examples. The oxide of implanted layer 970 has a high concentration of implanted species and a significant amount of implant damage while the oxide below this level has a low concentration of implanted species and little or no implant damage. Phosphorus ions (Ph+) and Silicon ions (Si+) are suitable for implantation in this step. The conductive FG3 layer provides protection against charging of the FG1 and FG2 portions. Because these portions are otherwise isolated, there is a danger that they could become highly charged during ion implantation and cause damage to gate dielectric portions 302a-302c, 304x, 304y. The FG3 layer connects all FG2 portions 640a-640c, 640x, 640y and FG1 portions 306a-306c, 306x, 306y together. Also, the FG3 layer is generally formed in a furnace process so that FG3 extends around the substrate to form an electrically continuous layer that may be in contact with a chuck or support. Thus, the FG3 layer allows any electrical charge that could build up in implanted layer 970 to discharge by flowing through the FG3 layer and then away from the substrate. Some simulation results are provided for Phosphorous implantation in Table 1, to depict options for how one can setup a process to target certain implanted oxide depth.

TABLE 1

Implant simulation results:
With Ph+ implant dose: 1.0E15 atm/cm2.
FG3 Thickness = 500 A.

| Energy | Concentration | Oxide Depth |
|---|---|---|
| 20 KeV | 8.3E17 atm/cm3 | 280 A |
| | 8.3E14 atm/cm3 | 560 A |

Figure 10:
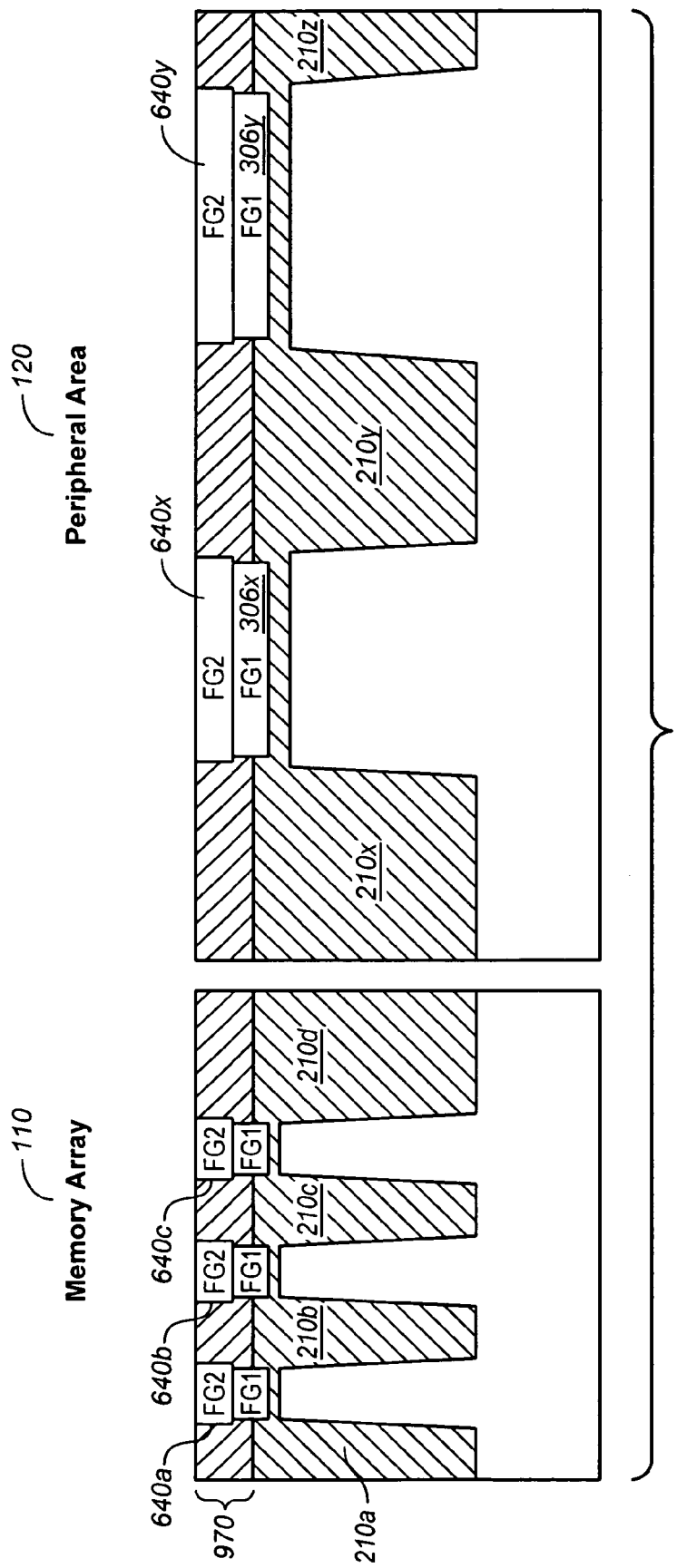
FIG. 10 shows the chip of FIG. 9 after removal of the second and third gate layers down to the level of the top of the STI structures

Subsequent to implanting ions into the oxide, the FG3 layer may be removed. This is done by CMP or etch of the polysilicon layers down to the level of the top of the STI structures 210a-210d, 210x-210z as shown in FIG. 10. Both the FG3 layer and portions of FG2 are removed in this step At this point, the upper surface of the substrate is flat because the FG2 portions 640a-640c, 640x, 640y are leveled with STI structures 210a-210d, 210x-210z. The wide FG2 portions 640x, 640y of peripheral area 120 may be planarized without dishing by this step because at the start of this step the upper surface of the polysilicon layer was substantially planar.

Figure 11:
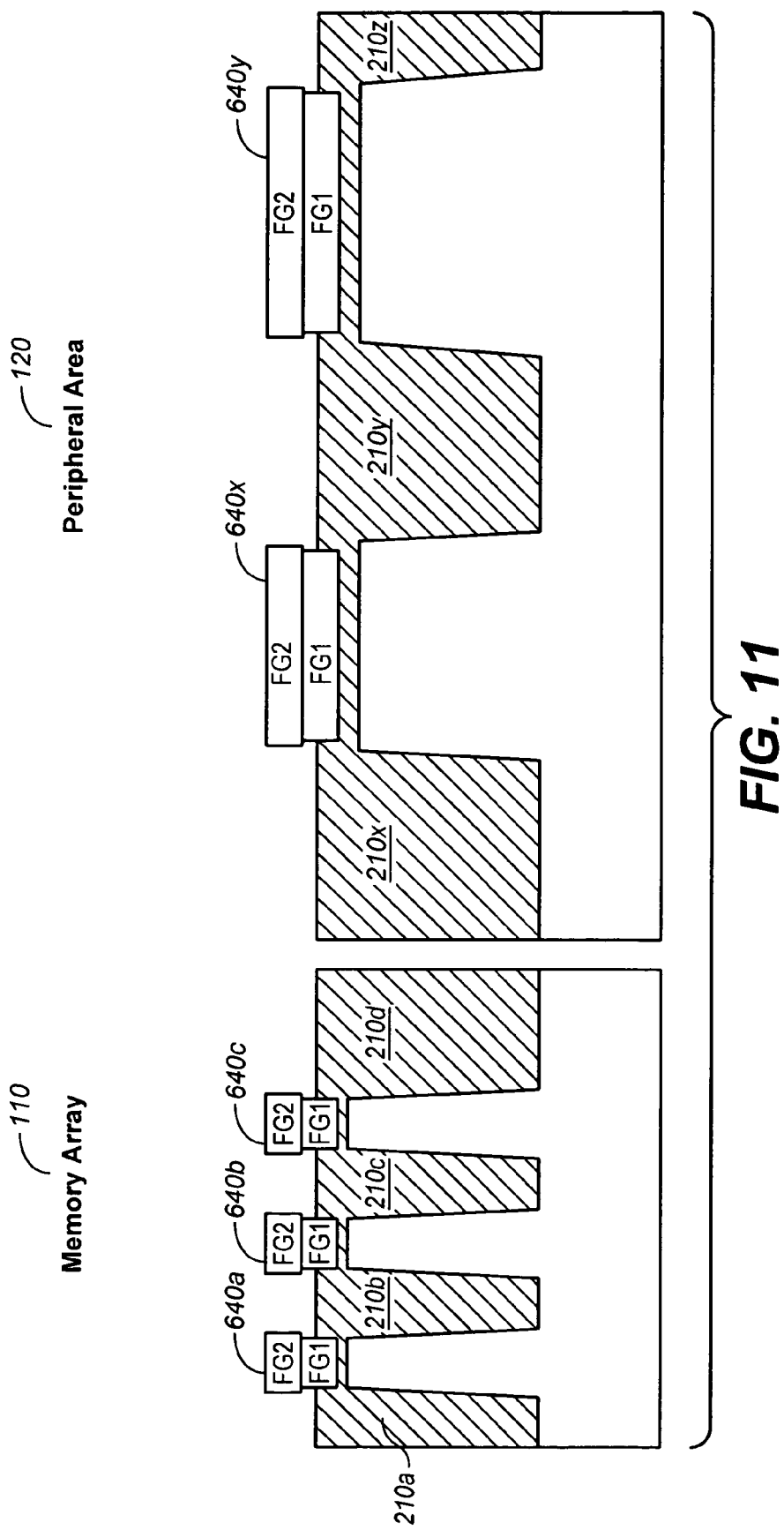
FIG. 11 shows the chip of FIG. 10 after selective removal of implanted STI oxide.

After the polysilicon is removed, an oxide etch-back is performed to remove an upper layer of the STI structures 210a-210c, 210x-210z. FIG. 11 shows the result of the removal of implanted layer 970 of the STI structures 210a-210c, 210x-210z. The oxide that is removed from the STI structures is the oxide that is implanted. Implanted oxide has a higher etch rate than unimplanted oxide. Thus, ion implantation is used to increase the etch rate of the upper layer of oxide while leaving the rest of the oxide largely unchanged. This provides a way to selectively etch only the implanted layer of oxide 970 and to stop at a predetermined depth that is established by ion implantation. The etch rate may be higher for implanted oxide because of damage caused by ions and also because of the chemical effects of the presence of ions. An etch chemistry may be chosen to be compatible with the particular ion implantation scheme used. For example, depending on the implanted species (p-type or n-type) a suitable etch may be chosen that will preferentially etch oxide with that species. The etch rate for implanted oxide may be more than double that of unimplanted oxide. Where implantation is not used to control etch depth, underetching and overetching may occur leading to poor device performance or device failure. In the present example, oxide etch-back is achieved with a wet-etch using a dilute Hydrofluoric acid (HF) followed by an additional Reactive Ion Etch (RIE).

Figure 12:
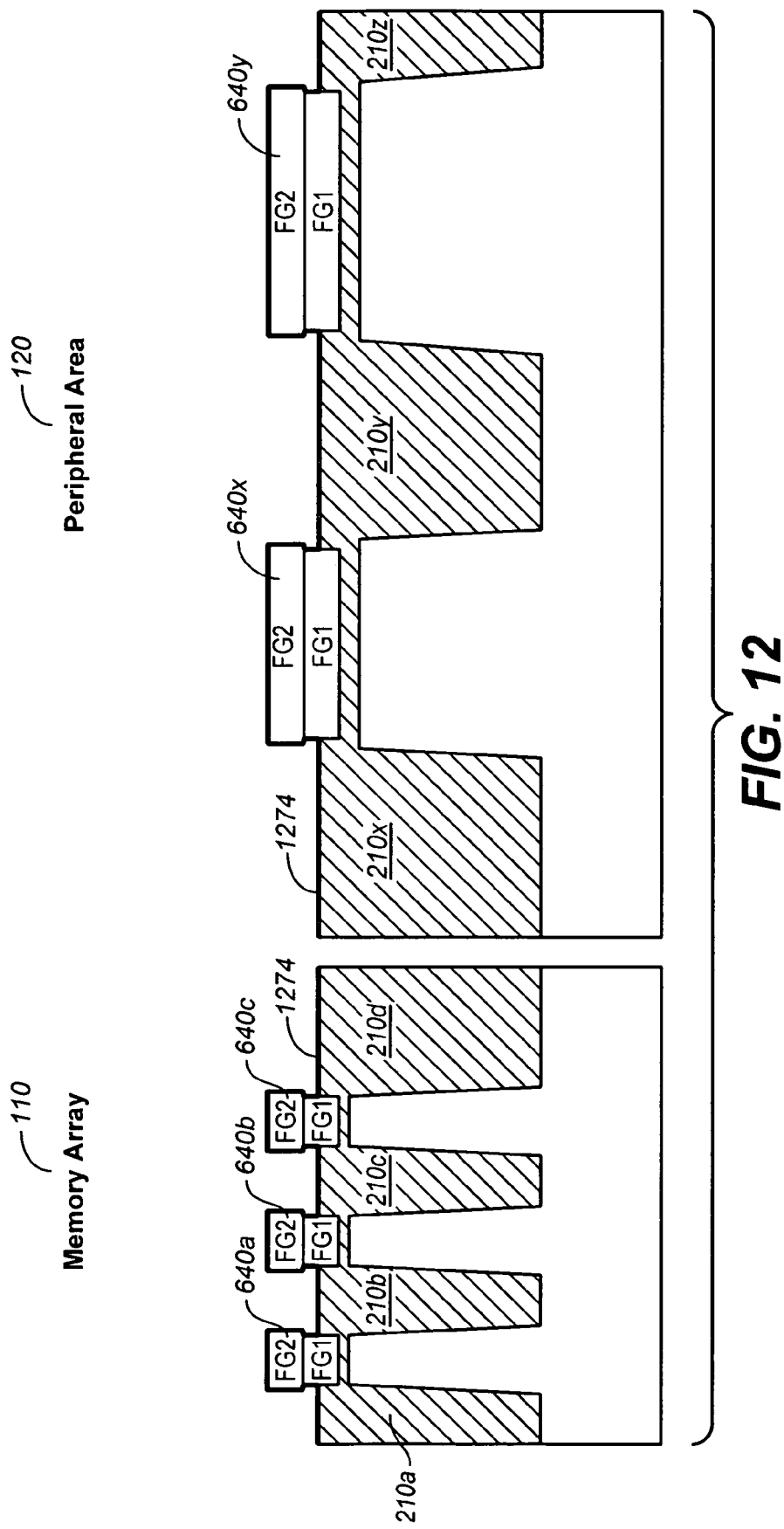
FIG. 12 shows the chip of FIG. 11 after deposition of a dielectric layer across the substrate.

Following the removal of implanted layer 970 of STI structures 210a-210d, 210x-210z, a dielectric layer 1274 is deposited over the surface of the substrate including FG2 portions 640a-640c, 640x, 640y and STI structures 210a-210d, 210x-210z as shown in FIG. 12. Dielectric layer 1274 may be an oxide or nitride layer or may be a compound layer made up of sublayers such as oxide-nitride-oxide (ONO). Subsequent to depositing dielectric layer 1274, a conductive layer is deposited over the substrate.

Figure 13:
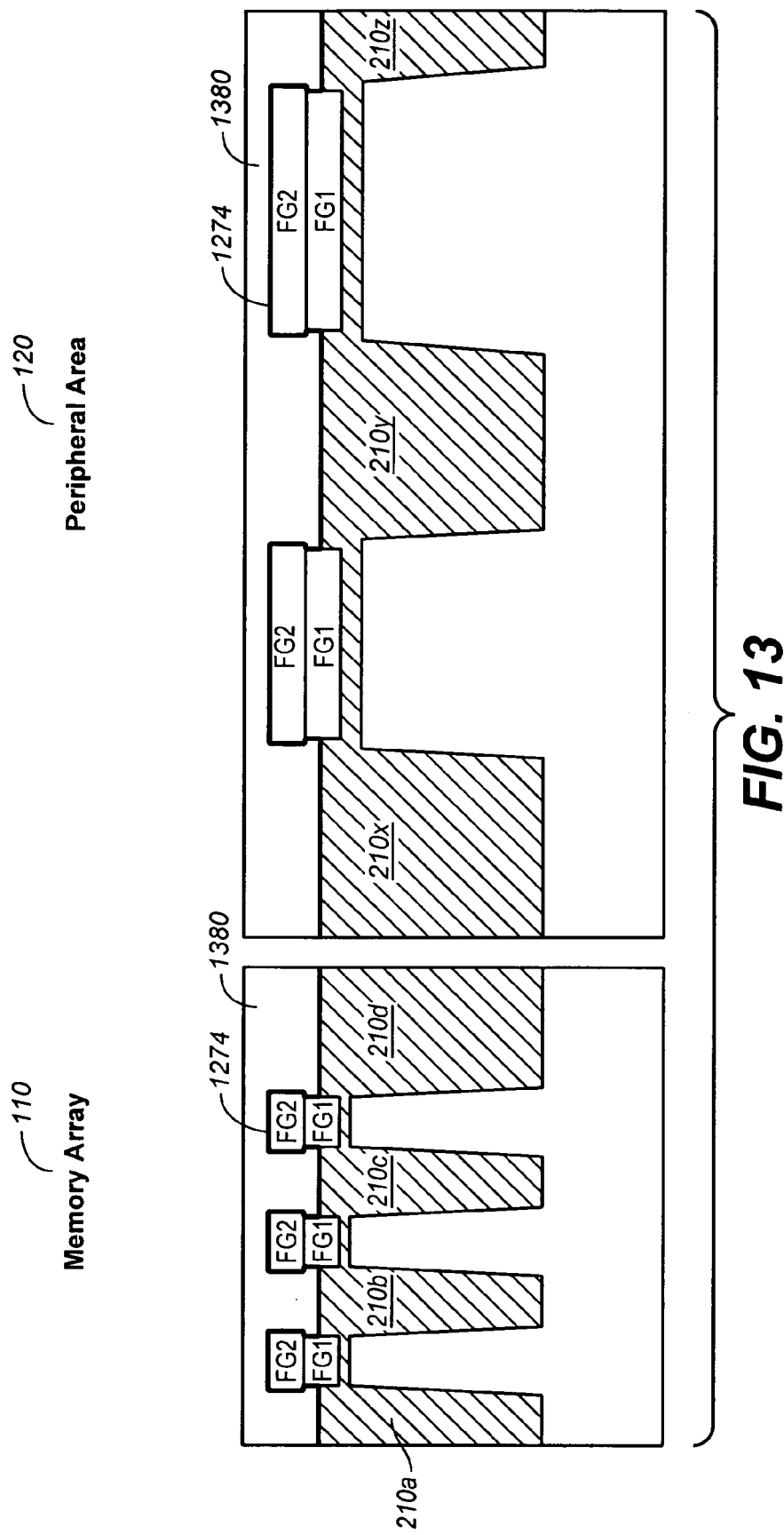
FIG. 13 shows the chip of FIG. 12 after deposition of control gate polysilicon over the dielectric layer to form a control gate layer.
Figure 14:
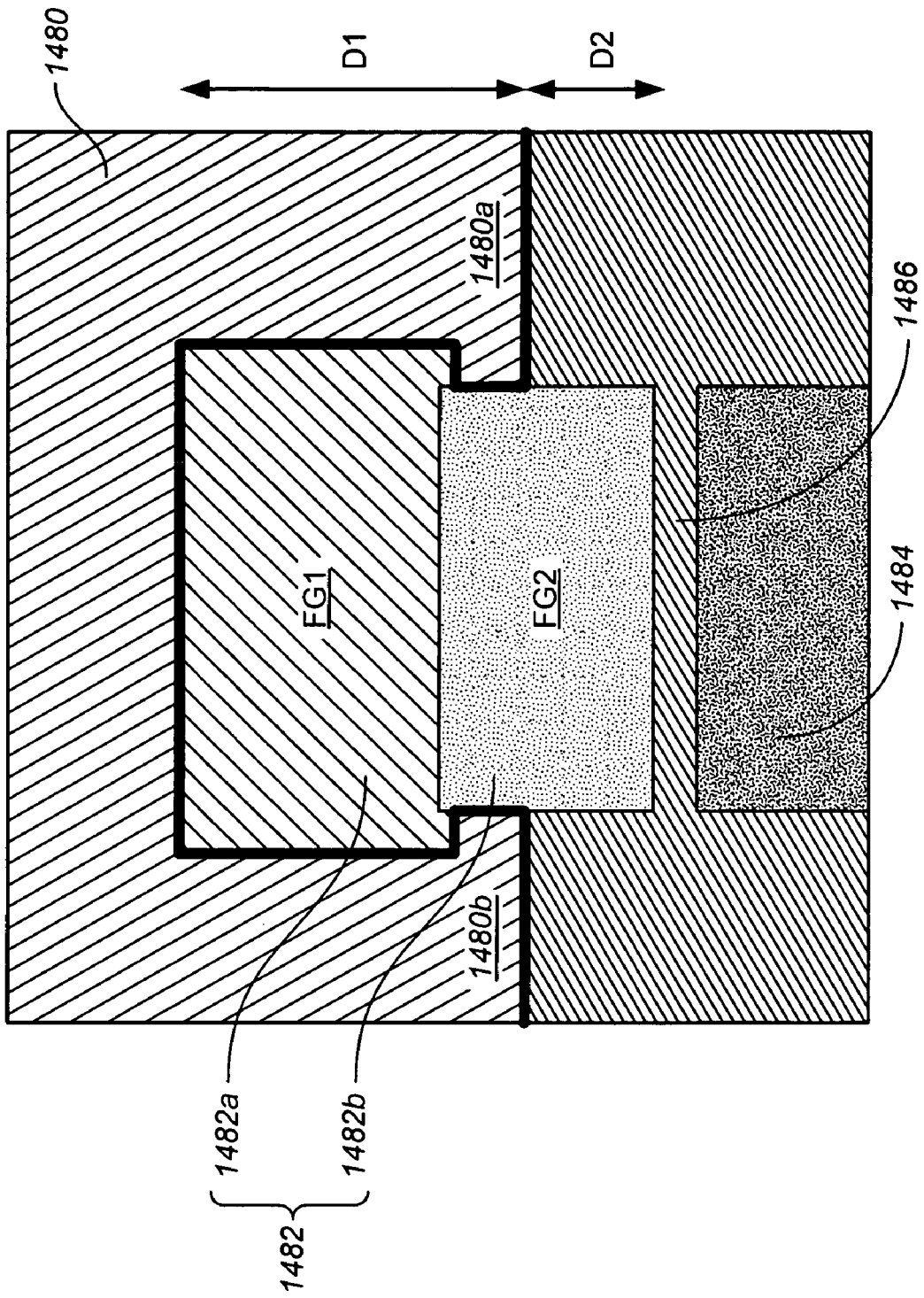
FIG. 14 shows a more detailed view of a floating gate similar to those of FIG. 13.

FIG. 13 shows the substrate with a conductive layer 1380 overlying dielectric layer 1274. Conductive layer 1380 is used to form control gates. Control gates are generally formed by patterning conductive layer 1380 into strips (wordlines) that extend across the substrate surface in a direction perpendicular to STI structures 210a-210d in memory array 110. Floating gates may be formed by the same step by etching exposed parts of the floating gate portions (FG1 portions 306a-306c and FG2 portions 640a-640c) that are between wordlines. The structure shown provides a large coupling area between the floating gates and control gates as shown in more detail in FIG. 14. The floating gate 1482 is a typical floating gate of memory array 110 and is made up of an FG1 portion 1482a and an FG2 portion 1482b. The control gate 1480 extends vertically between floating gates to a depth D1, so that extensions 1480a, 1480b of the control gate 1480 extend into the gaps where implanted layer 970 of STI structures 210a-210d was removed. Control gate extensions 1480a, 1480b provide two benefits. Firstly, they increase the coupling area between floating gate 1482 and control gate 1480. Secondly, they reduce coupling between adjacent floating gates by providing a conductive barrier between them. Accurate control of the vertical dimension D1 of extensions 1480a, 1480b is important to device performance. Variation in this dimension may cause variation in coupling ratio causing some devices to perform outside permitted limits. It is desirable to have the distance D2 between control gate 1480 and gate dielectric 1486 greater than a minimum value. If extensions 1480a, 1480b extend too deeply they may affect channel region 1484 that underlies FG1 portion 1482b, gate dielectric portion 1486, and the cell reliability. It has been found that for the 55 nm process, the extensions should be kept at least 200 Angstroms above the gate dielectric 1486 (i.e. D2 should be at least 200 Angstroms). For other processes this minimum distance may vary. Typically, the minimum distance between control gate extensions 1480a, 1480b and gate dielectric 1486 should be at least as great as the thickness of the gate dielectric 1486. Where a timed etch is used to remove the upper layer of STI structures, variation in the etched depth may occur. By using ion implantation to modify the oxide and then performing a selective etch that is selective to implanted layer 970, the depth of the etch may be controlled to a higher precision and device uniformity may be improved.

Table 2 shows some simulation results for memory cells having two different oxide etch-back depths (and thus, two different control gate extension lengths).

TABLE 2

Cell Simulation Results:

| FG1 Width: | 50 nm | 50 nm |
|---|---|---|
| FG2 Width: | 60 nm | 60 nm |
| EB Amount, D1: | 60 nm | 50 nm |
| Channel L: | 51 nm | 51 nm |
| →Coupling Ratio | 49.8% | 46.7% |
| →Total Yup | 446 mV | 534 mV |

The results are for two cells having identical FG1 and FG2 dimensions and channel lengths. The results show that if the etch-back amount (D1) is decreased from 60 nm to 50 nm (600 Angstroms to 500 Angstroms), the coupling ratio drops from 49.8% to 46.7% and coupling between neighboring cells increases. "Total Yup" refers to the Yupin effect between neighboring cells. "Yupin effect" is a term used to describe the undesirable coupling between neighboring cells whereby the charge level of one floating gate affects the threshold voltage of a neighboring cell. This effect is described in detail in U.S. Pat. No. 5,867,429, which patent is incorporated by reference in its entirety. Thus, it can be seen that Yupin effect increases when D1 is reduced from 60 nm to 50 nm, eventually affecting device performances.

Figure 15A:
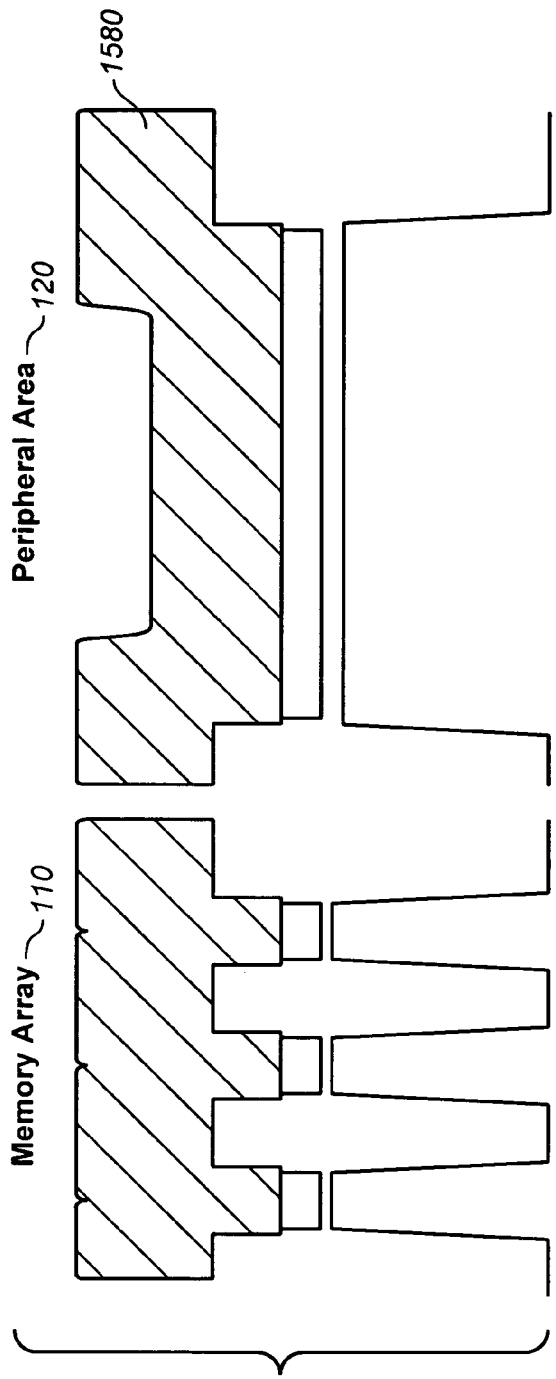
FIG. 15A shows a cross-section of a structure like that of FIG. 5 prior to CMP.
Figure 15B:
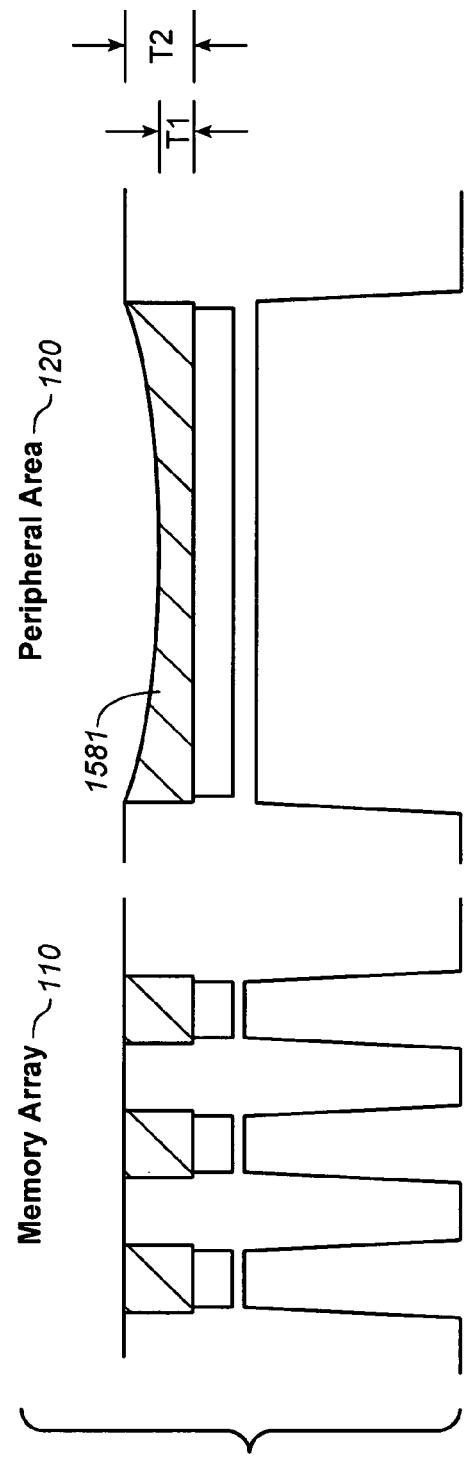
FIG. 15B shows a cross-section of the structure of FIG. 15A after CMP.

In addition to improving the formation of control gates, the process described prevents dishing of large polysilicon portions in the peripheral region. When a surface having wide depressions undergoes CMP, dishing may occur so that depressions still exist in the surface after CMP (though the depth of the depression relative to the surrounding surface may be reduced). For example, if CMP is applied to the FG2 layer of FIG. 5, dishing might be expected over FG1 portions 306x, 306y in peripheral area 120. FIG. 15A shows a cross-section of a structure like that of FIG. 5 prior to planarization. FIG. 15B shows the results of planarizing the structure of 15A. A substantially planar surface is produced in memory array 110. However, in peripheral area 120 the polysilicon of FG1 layer 1580 suffers dishing during CMP. The resulting FG2 portion 1581 has a thickness of T2 at the edges of a large FG2 structure but has a thickness of T1 in the middle. T1 is less than T2 so that the cross-sectional area is reduced and the resistance of such a structure is increased. Dishing is the result of CMP erosion at the bottom of a wide depression while planarizing the surface. By providing protrusions that extend above the level of the upper surface of the polysilicon layer over most of the surface, a soft etch may selectively remove the protrusions down to the level of the upper surface over the rest of the substrate and thus form a highly planarized surface. Thus, FIG. 8 shows a substantially planar upper polysilicon surface of FG2 and FG3 portions. Later applying CMP to this surface provides FG2 portions (in FIG. 10) that do not significantly suffer from dishing. Control of the thickness of FG2 portions in the peripheral area is particularly important because these portions may be used as resistors. By providing protrusions and adding an additional polysilicon layer, better control of FG2 thickness in the peripheral area and avoidance of dishing may be achieved. In some embodiments, such control of FG2 thickness may not be so critical. In these cases, the FG2 layer shown in FIG. 5 may be planarized by CMP to provide a similar result to that shown in FIG. 15B.

Figure 16:
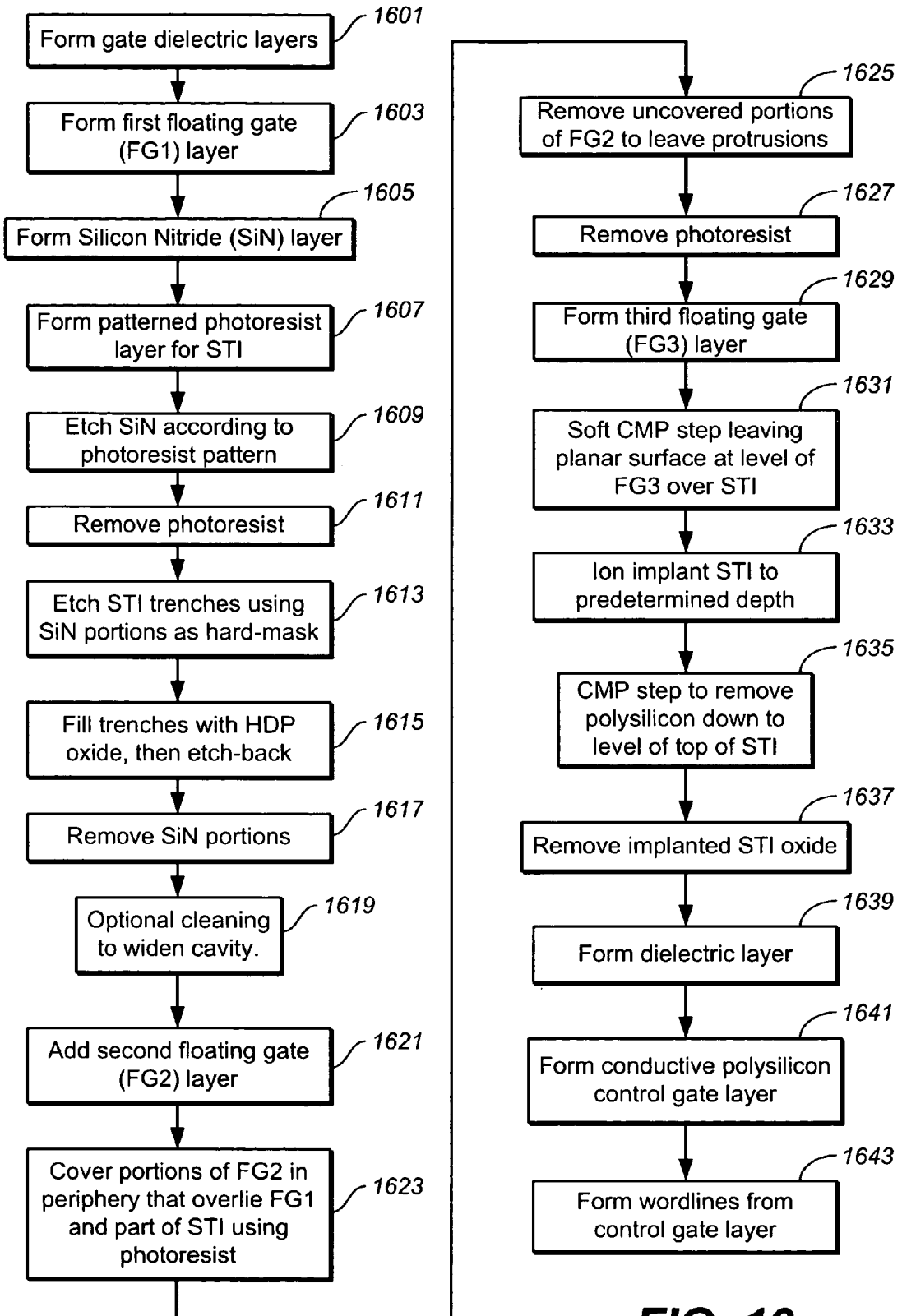
FIG. 16 is a flowchart of the process described in FIGS. 3-14.

FIG. 16 is a flowchart of the process steps described above. First, gate dielectric layers are formed over different areas of the substrate 1601. Then, a first floating gate (FG1) layer is formed 1603 over the gate dielectric layers and a Silicon Nitride (SiN) layer is formed 1605 over the FG1 layer. A patterned photoresist layer is formed 1607 over the SiN layer and the SiN layer is etched 1609 into separate portions according to the pattern. The photoresist is then removed 1611. The remaining SiN portions are then used as a hard-mask to etch STI trenches 1613. The trenches are filled with HDP oxide and etched-back 1615. SiN portions are removed 1617 and a cleaning step is (optionally) performed to open the cavities left after SiN removal 1619. A second floating gate layer (FG2) is then deposited 1621. Portions of FG2 in the peripheral area are covered 1623. The covered portions extend over FG1 portions and extend out over the edges of the adjacent STI structures. Uncovered portions of FG2 are then removed 1625. Then, the photoresist is removed 1627 leaving protrusions of FG2 over the STI structures. A third floating gate (FG3) layer is formed 1629 and includes protrusions where FG3 overlies FG2 protrusions. A soft CMP step is performed 1631 to remove protrusions and planarize the substrate to the level of the top surface of the FG3 layer over the STI structures. Next, ions are implanted 1633 through the conductive polysilicon into the STI oxide to a predetermined depth. The polysilicon is then removed 1635 down to the level of the top surface of the STI structures. Implanted STI is then selectively etched away 1637. A dielectric layer is formed 1639 over the floating gate portions and a conductive control gate layer is formed 1641 over the dielectric layer. Wordlines are formed 1643 by etching the control gate layer into separate strips.

Although the invention has been described with respect to various exemplary embodiments, it will be understood that the invention is entitled to protection within the full scope of the appended claims.

The invention claimed is:

1. A method of making a memory system on a semiconductor substrate, comprising:
    forming a plurality of shallow trench isolation structures separating floating gate structures;
    implanting ions into the plurality of shallow trench isolation structures;
    etching the plurality of shallow trench isolation structures such that portions of shallow trench isolation structures that have a high concentration of implanted ions etch faster than portions of shallow trench isolation structures that have a low concentration of implanted ions; and
    stopping etching the plurality of shallow trench isolation structures at a depth where the concentration of implanted ions is less than a maximum concentration and where the etch rate is decreasing with increasing etch depth, wherein hard-mask portions define locations of the shallow trench isolation structures and, after the defining locations of shallow trench isolation structures, the hard-mask portions are replaced with conductive floating gate portions.

2. The method of claim 1 further comprising forming an electrically conductive polysilicon layer overlying the plurality of shallow trench isolation structures prior to implanting ions across the substrate.

3. The method of claim 2 wherein the conductive polysilicon layer is planarized prior to implanting ions.

4. The method of claim 1 wherein the semiconductor substrate includes a memory array and a peripheral area and individual shallow trench isolation structures are present in both the memory array and the peripheral area.

5. A method of making a memory system on a semiconductor substrate including a memory array in a memory array region and peripheral circuits in a peripheral region, comprising:
   forming a plurality of shallow trench isolation structures in both the memory array region and the peripheral region, shallow trench isolation structures of the peripheral region being larger than shallow trench isolation structures of the array region;
   implanting ions across the substrate including the plurality of shallow trench isolation structures;
   etching the plurality of shallow trench isolation structures with an etch that etches portions of shallow trench isolation structures that have a high concentration of implanted ions faster than it etches portions of shallow trench isolation structures that have a low concentration of implanted ions;
   stopping etching the plurality of shallow trench isolation structures at a depth where the concentration of implanted ions is less than a maximum concentration and where the etch rate is decreasing with increasing etch depth; and
   forming floating gates in the memory array region, the floating gates separated by the shallow trench isolation structures prior to etching, upper portions of shallow trench isolation structures directly between floating gates being removed by the etching, a dielectric layer and control gate subsequently formed that extend directly between floating gates where the upper portions of shallow trench isolation structures are removed.

6. The method of claim 5 further comprising forming an electrically conductive polysilicon layer overlying the plurality of shallow trench isolation structures prior to implanting ions across the substrate.

7. A method of planarizing a substrate for memory devices, comprising:
   forming a plurality of first conductive portions separated by shallow trench isolation structures, the shallow trench isolation structures extending above an upper surface of the plurality of first conductive portions;
   forming a plurality of second conductive portions, an individual second conductive portion extending partially over an upper surface of a first conductive portion and partially over a shallow trench isolation structure;
   subsequently forming a conductive layer that extends across the substrate including the second conductive portions;
   planarizing the conductive layer by removing portions of the conductive layer that extend higher than an upper surface of a portion of the conductive layer that directly overlies a shallow trench isolation structure; and
   implanting ions through the planarized conductive layer into the shallow trench isolation structures.

8. The method of claim 7 wherein removing portions of the conductive layer that extend higher than an upper surface of a portion of the conductive layer that directly overlies a shallow trench isolation structure is by chemical mechanical polishing.

9. The method of claim 8 wherein the chemical mechanical polishing is performed with a pressure between the substrate and a pad that erodes the portions of the conductive layer that extend higher than an upper surface of a portion of the conductive layer that directly overlies a shallow trench isolation structure while not significantly eroding the upper surface of the portion of the conductive layer that directly overlies the shallow trench isolation structure.

10. The method of claim 7 further comprising subsequently removing the first conductive layer and subsequently etching portions of the shallow trench isolation structures that have an implanted ion concentration above a threshold value but not removing portions of the shallow trench isolation structures that have an implanted ion concentration below the threshold value.

11. The method of claim 7 wherein the conductive layer is formed in direct contact with the plurality of second conductive portions.

12. The method of claim 7 wherein individual second conductive portions are wider than individual first conductive portions.

* * * * *

UNITED STATES PATENT AND TRADEMARK OFFICE
CERTIFICATE OF CORRECTION

PATENT NO. : 7,541,240 B2 Page 1 of 1
APPLICATION NO. : 11/254142
DATED : June 2, 2009
INVENTOR(S) : Pham It is certified that error appears in the above-identified patent and that said Letters Patent is hereby corrected as shown below:

Col. 16, line 2 claim 7: after "extending" and before "over" delete "partially."

Signed and Sealed this

Twenty-ninth Day of September, 2009

David J. Kappos
*Director of the United States Patent and Trademark Office*